United States Patent [19]
Johnson

[11] Patent Number: 6,140,838
[45] Date of Patent: Oct. 31, 2000

[54] HIGH DENSITY AND HIGH SPEED MAGNETO-ELECTRONIC LOGIC FAMILY

[76] Inventor: Mark B. Johnson, 7742 Jewelweed Ct., Springfield, Va. 22152

[21] Appl. No.: 09/074,576

[22] Filed: May 7, 1998

Related U.S. Application Data

[63] Continuation-in-part of application No. 08/425,884, Apr. 21, 1995, Pat. No. 5,629,549, and a continuation-in-part of application No. 08/493,815, Jun. 22, 1995, Pat. No. 5,565,695, and a continuation-in-part of application No. 08/643,805, May 6, 1996, Pat. No. 5,652,445, and a continuation-in-part of application No. 08/643,804, May 6, 1996, Pat. No. 5,654,566, and a continuation-in-part of application No. 08/806,028, Feb. 24, 1997, and a continuation-in-part of application No. 09/005,855, Jan. 12, 1998.

[51] Int. Cl.$^7$ ........................................................ G06F 7/38
[52] U.S. Cl. ................................ 326/39; 326/47; 326/136
[58] Field of Search .................................. 326/21, 37, 47, 326/106, 136; 327/427, 435, 437, 581

[56] References Cited

U.S. PATENT DOCUMENTS

| | | | |
|---|---|---|---|
| 3,631,260 | 12/1971 | Yoshino | 307/206 |
| 4,314,349 | 2/1982 | Batcher | 364/716 |
| 4,558,236 | 12/1985 | Burrows | 326/50 |
| 4,607,271 | 8/1986 | Popovic et al. | 357/27 |
| 4,811,258 | 3/1989 | Andersen | 364/713 |
| 4,876,466 | 10/1989 | Kondou et al. | 326/38 |
| 4,896,296 | 1/1990 | Turner et al. | 365/189.08 |
| 4,905,178 | 2/1990 | Mor et al. | 364/748 |
| 4,931,670 | 6/1990 | Ting | 326/117 |
| 4,978,842 | 12/1990 | Hinton et al. | 250/213 |
| 4,992,654 | 2/1991 | Crossland et al. | 250/213 |
| 4,999,687 | 3/1991 | Luryi et al. | 357/16 |
| 5,019,736 | 5/1991 | Furtek | 307/465 |
| 5,024,499 | 6/1991 | Falk | 350/96.11 |
| 5,058,034 | 10/1991 | Murphy et al. | 364/513 |
| 5,089,991 | 2/1992 | Matthews | 365/9 |

(List continued on next page.)

OTHER PUBLICATIONS

Application Note, "Atmel PLD Frequently Asked Questions," p. (8–119)–(8–128), (1997).
James Daughton, "Magnetoresistive Memory Technology," Thin Solid Films, vol. 216, 162 (1992).
R. Meservey, P. M. Tedrow and P. Fulde, Phys. Rev. Lett. 25, 1270 (1970).
P.M. Tedrow and R. Meservey, Phys. Rev. Lett. 26, 192 (1971).
P.M. Tedrow and R. Meservey Phys. Rev. B 7, 318 (1973).
Mark Johnson and R. H. Silsbee, Phys. Rev. Lett. 55, 1790 (1985).
Mark Johnson and R. H. Silsbee Phys. Rev. B 35, 4959 (1987).
Mark Johnson and R. H. Silsbee, Phys. Rev. B 37, 5312 (1988).

(List continued on next page.)

*Primary Examiner*—Michael Tokar
*Assistant Examiner*—Anh Tran
*Attorney, Agent, or Firm*—Law+

[57] ABSTRACT

A number of novel new devices and circuits are disclosed utilizing configurable magneto-electronic elements such as magnetic spin transistors and hybrid hall effect devices. Such magneto-electronic elements can be used as building blocks of an entirely new family of electronic devices for performing functions not easily implementable with semiconductor based device. A number of examples are provided, including logic gates that can be programmed to perform different boolean logic operations at different periods of time. Logic devices and circuits incorporating such logic gates have a number of operational advantages and benefits over conventional semiconductor based technologies, including the fact that traditional signal logic operations can be implemented with substantially fewer active elements. A conventional boolean function unit, for example, can be constructed with 2 magneto-electronic elements, and 2 semiconductor elements, which is a 400% improvement over prior art pure semiconductor based technologies.

57 Claims, 12 Drawing Sheets

U.S. PATENT DOCUMENTS

| | | | |
|---|---|---|---|
| 5,109,156 | 4/1992 | Evans et al. | 250/213 |
| 5,115,497 | 5/1992 | Bergman | 395/375 |
| 5,155,434 | 10/1992 | Fujimaki | 324/248 |
| 5,218,245 | 6/1993 | Kohler | 307/465 |
| 5,237,529 | 8/1993 | Spitzer | 365/158 |
| 5,239,504 | 8/1993 | Brady et al. | 365/157 |
| 5,245,226 | 9/1993 | Hood et al. | 307/465 |
| 5,245,227 | 9/1993 | Furtek et al. | 307/465 |
| 5,251,170 | 10/1993 | Daughton et al. | 365/158 |
| 5,289,410 | 2/1994 | Katti et al. | 365/170 |
| 5,329,480 | 7/1994 | Wu et al. | 365/170 |
| 5,361,373 | 11/1994 | Gilson | 395/800.01 |
| 5,396,455 | 3/1995 | Brady et al. | 365/170 |
| 5,420,819 | 5/1995 | Pohm | 365/158 |
| 5,424,236 | 6/1995 | Daughton et al. | 437/52 |
| 5,432,373 | 7/1995 | Johnson | 257/421 |
| 5,452,163 | 9/1995 | Coffey et al. | 360/113 |
| 5,475,277 | 12/1995 | Johnson | 310/156 |
| 5,488,250 | 1/1996 | Hennig | 257/421 |
| 5,491,338 | 2/1996 | Spitzer | 250/307 |
| 5,543,737 | 8/1996 | Ovshinksy | 326/104 |
| 5,580,814 | 12/1996 | Larson | 437/52 |
| 5,594,366 | 1/1997 | Khong et al. | 326/41 |
| 5,600,845 | 2/1997 | Gilson | 395/800.39 |
| 5,621,338 | 4/1997 | Liu et al. | 326/46 |
| 5,652,875 | 7/1997 | Taylor | 395/500 |
| 5,684,980 | 11/1997 | Casselman | 395/500 |
| 5,757,525 | 5/1998 | Rao et al. | 359/108 |
| 5,794,062 | 8/1998 | Baxter | 395/800.3 |
| 5,862,286 | 1/1999 | Imanishi et al. | 385/122 |

OTHER PUBLICATIONS

Mark Johnson and R. H. Silsbee, Phys. Rev. B 37, 5326 (1988).

Mark Johnson, "The All Metal Spin Transistor," I.E.E.E. Spectrum Magazine, vol. 31 No. 5 p. 47 (1994).

Mark Johnson, "The Bipolar Spin Switch," Science 260, 320 (1993).

R. S. Popovi'c, "Hall–effect Devices," Sens. Actuators 17, 39 (1989).

J. De Boeck, J. Harbison et al., "Non–volatile Memory Characteristics of Submicrometer Hall Structures Fabricated in Epitaxial Ferromagnetic MnAl Films on GaAs," Electronics Letters 29, 421 (1993).

Paul Horowitz and Winfield Hill, "The Art of Electronics," Cambridge Univ. Press, Cambridge U.K. (1980); p. 328.

|    | AND | OR | NAND | NOR |
|----|-----|-----|------|-----|
| C  | 0   | 1   | 0    | 1   |
| B1 | 1   | 1   | 0    | 0   |
| B2 | 0   | 0   | 1    | 1   |

|    | NAND | NOR | AND | OR | XOR |
|----|------|-----|-----|----|----|
| C1 | 0    | 1   | NA  | NA | 0   |
| C2 | NA   | NA  | 0   | 1  | 1   |
| B1 | 1    | 1   | 0   | 0  | 1   |
| B2 | 0    | 0   | 1   | 1  | 1   |

Inverted Output

|    | AND | OR | NAND | NOR | XNOR |
|----|-----|----|------|-----|------|
| C1 | 0   | 1  | NA   | NA  | 0    |
| C2 | NA  | NA | 0    | 1   | 1    |
| B1 | 1   | 1  | 0    | 0   | 1    |
| B2 | 0   | 0  | 1    | 1   | 1    |

Noninverted Output

| Output | R1 | R2 | R3 | R4 |
|--------|----|----|----|----|
| AND    | 0  | 0  | 1  | 0  |
| OR     | 1  | 1  | 1  | 0  |
| NAND   | 1  | 1  | 0  | 1  |
| NOR    | 0  | 0  | 0  | 1  |
| XOR    | 1  | 1  | 0  | 0  |
| XNOR   | 0  | 0  | 1  | 1  |

| Time | Read Signal | Output |
|---|---|---|
| T1 | R1 | O1=A * B (AND) |
| T1 | R3 | O3=A+B (OR) |
| T2 | R2 + R3 | O2= /A * /B (NAND) |
| T3 | R1 | O1= (A+B) + (/A * /B) XNOR |
| T4 | R2 | O2=/((AB + /A*/B)) XOR |

HIGH DENSITY AND HIGH SPEED MAGNETO-ELECTRONIC LOGIC FAMILY

RELATED APPLICATIONS

The present application is a continuation-in-part of the following:

Ser. No. 08/425,884 is now U.S. Pat. No. 5,629,549 filed Apr. 21, 1995;

Ser. No. 08/493,815 is now U.S. Pat. No. 5,565,695 filed Jun. 22, 1995;

Ser. No. 08/643,805 is now U.S. Pat. No. 5,652,445 filed May 6, 1996;

Ser. No. 08/643,804 is now U.S. Pat. No. 5,654,566 filed May 6, 1996; and

Ser. No. 08/806,028 filed Feb. 24, 1997, and

Ser. No. 09/005,855 filed Jan. 12, 1998.

The above materials are hereby expressly incorporated by reference herein.

STATEMENT AS TO GOVERNMENT RIGHTS

This application was filed during a time when the inventor was employed by the Naval Research Laboratory as part of Task Area MA02-01-46, Work Unit T042-97, and while he was the principal investigator for contract number N000-1499-AF0002 from the Office of Naval Research. The government may have certain rights to some or all portions of the inventions herein.

FIELD OF THE INVENTION

This invention relates generally to high speed logic circuits constructed from magneto-electronic devices. Such devices can include magnetic spin transistors, hybrid hall effect devices, etc., and can be constructed in a variety of different ways, including as elements integrated in silicon with conventional semiconductor elements. The new circuits can be implemented as replacements for other conventional logic circuits, including programmable logic devices, boolean logic gates, boolean function units, arithmetic logic units, etc., and also can be used to construct novel new circuits including transformable logic circuits and elementary computing machines.

BACKGROUND OF THE INVENTION

My prior patents describe a number of embodiments of novel magneto-electronic elements which have beneficial uses in a wide variety of environments.

For example, the physical theory, structure and operation of a novel magnetic (or metal) spin transistor (MST) device used as a read head for a magnetic hard disk is described in U.S. Pat. No. 5,432,373. Further, in my U.S. Pat. No. 5,565,695 I described, among other things, the specific structure and operation of an improved MST device with broader applicability to a wider variety of environments, including non-volatile storage. A typical application for such MST device includes use as memory cell in an array of independent, randomly accessible elements, as a replacement for traditional magnetic storage media, DRAM, etc. As also indicated in the '695 patent, a typical semiconductor element such as a FET (or diode) can be used to great advantage to isolate and couple magnetic spin transistor elements in such arrays.

Similarly, in U.S. Pat. No. 5,629,549, the same novel magnetic spin transistor devices are described as building blocks of novel and powerful logic gates. Through suitable selections of input signals and/or configuration states of the ferromagnetic layers of such devices, a variety of conventional Boolean logic operations can be effectuated, including AND, OR, NAND, NOR, NOT, etc. The aforementioned patent also explains a further useful implementation in which the output of one device is inductively coupled to drive an input of a next stage device.

Additionally, in U.S. Pat. No. 5,654,566, yet another useful embodiment of a magnetic spin transistor is described, in which base and (configurable) collector ferromagnetic layers are coupled directly to the source and drain of a conventional semiconductor field effect transistor. In this manner, the conductivity of a FET channel can be controlled to permit or inhibit flow of spin polarized electrons between the two ferromagnetic layers. Depending on the orientation of the collector layer vis-a-vis the base, the amount of spin current will vary, thus implementing a non-volatile memory or logic element that is integrated with conventional silicon gate technology.

Finally, in U.S. Pat. No. 5,652,445 I introduced yet another magneto-electronic element which is referred to generally as a Hybrid Hall Effect (HHE) device. Unlike the MST devices above, the HHE device does not make use of spin-polarized current, but, rather, a conventional electron current induced in a Hall plate by a configurable ferromagnetic layer coupled to the Hall plate. Nevertheless, the HHE device inherently includes all of the operational benefits of the MST devices above, including non-volatility, flexible and useful configurability of the magnetization states, small feature size, ease of manufacturability, etc.

Furthermore, unlike any conventional semiconductor devices known to the applicant, both the HHE and MST devices above have operational characteristics that scale inversely with size. In other words, for a constant current source, the readout voltage is improved as device size is decreased. This feature alone makes such devices an especially attractive alternative to typical semiconductor devices for extremely small geometries.

Consequently, the physics, structure, operation and formation of magnetic spin transistor and HHE devices are well known based on the description in my prior patents, including U.S. Pat. Nos. 5,432,373, 5,629,549, 5,565,695, 5,654, 566 and 5,652,445.

As a general rule in the art of electronics, with all things being equal, a most useful circuit is one that uses the least number of devices (highest integration) to perform the most functions. For this reason, skilled artisans spend considerable man-hours each year trying to come up with designs for conventional logic circuits (such as boolean function units, boolean logic gates, adders, multipliers, etc.) that require the least number of active devices to implement. This dynamic is based on the fact that again, all things being equal, fewer devices generally translate into higher processing density, lower power, higher speed, lower cost, etc. To date, such circuits have been implemented in a variety of silicon based technologies (RTL, TTL, CMOS, ECL, BiCMOS, etc.) and while improvements have been made in each such family, it is apparent that there is significant need for alternative technologies that minimize the number of electronic elements required to implement many commonly used functional logic circuits.

An example of a typical prior art universal logic circuit is depicted in U.S. Pat. No. 4,558,236 (Barrows). This reference shows a circuit that performs any one of a number of logic functions on two input signals; the particular logic function is dictated by a control signal. The circuit in Barrows, nevertheless, consists of at least 8 separate FETs not counting additional logic required to generate the inverse of at least one of the input signals.

A reference by Weste & Eshragian entitled "Principles of CMOS VLSI Design" (Addison-Wesley Publishing Co., $2^{nd}$ edition, 1993, pp. 306–307) also shows a typical multi-functional logic circuit known generally as a "Boolean Function Unit." This circuit, depicted in FIG. 5.35 of that reference, generates any one of 5 logical functions based on two inputs A and B, including AND, OR, NOR, NAND and XOR. The particular function implemented by the circuit is controlled by control signals P1, P2, P3 and P4 in the manner shown in Table 5.9 therein. As can be seen in this figure, however, the number of elements required to effectuate these five functions is at least eight separate FETs for nMOS implementation and 16 separate FETs for a CMOS implementation.

Similarly, a prior art 4*4 bit multiplier as described by Weste et. al. at pp. 545–547 is shown in FIG. 8.36. This type of circuit implemented with purely conventional semiconductor technology requires some 624 separate FETs, which take up an extremely large amount of substrate area. Weste also illustrates a traditional single bit adder at p.517, which can be seen as calling for some 28 transistors. Finally, a typical shifter circuit is also shown on pp. 560–562, and this corresponds generally to the circuit shown in FIG. 8.46 which includes some 56 separate FETs.

A common feature of all of these circuits is that they are extremely vital and necessary to the operation of many conventional processing units used today, but they nevertheless are commercially difficult to implement in a cost effective manner because they require so many active elements and so much associated chip space. While my prior patents have already discussed various magneto-electronic devices well suited for replacing single logic gates, to date there has been no attempt made to utilize such devices in higher level logic circuits such as the above.

In addition, there has also been a continuous need in the electronics industry for a single logic device that can be configured and re-configured dynamically to perform more than one logical function at a time. While there are some dynamically reconfigurable systems (i.e., large collections of gates corresponding to larger sets of active devices) in the prior art, to date there has been no instance of such functionality existing to implement a reconfigurable logical function for a single gate, or at an even more granular level, a single reconfigurable device. As an example, certain prior art programmable logic devices by companies such as Atmel and Lattice have some portions that are re-configurable. However, the functionality of these systems is only controllable at a relatively high level and the speed of re-programmability is relatively slow. There is no mechanism in such devices for transforming a single OR logic function block into an AND function block, and more fundamentally, for altering the FETs in an OR circuit to instead implement an AND function. In this respect, FIG. 1 is instructive, in that it depicts a typical prior art circuit implementing a NAND function for two single data inputs A and B. As can be seen here, even though this is a simple logic function, it nevertheless requires four (4) active FET devices, as well as associated interconnects and necessary isolation regions. Once such a device is fabricated in silicon, there is no means for "transforming" it into a different type of logic gate, and certainly no mechanism known for controlling a single FET to alter its behavior for example to switch from a p type to an n type device. Consequently it is apparent that a flexible, transformable logic device of this type would be an attractive replacement for conventional FETs.

Of equal importance and concern in the prior art is the relative integration density required to implement a particular set of logic functions. For example, Programmable Logic Devices (PLDs) are generally comprised of a large number of identical "macrocells" that are interconnected in some fashion to effectuate a desired result on a particular set of inputs and intermediary data/logic values. All things being equal, it is clearly most desirable to maximize the functionality (i.e., number of possible logical functions) of such macrocells while simultaneously minimizing the size of such a structure. There are limits to what can be done to effectuate these critical design parameters, however, given the peculiarities and requirements of conventional semiconductor devices.

Moreover, while it would be indisputably useful in many instances, there are no simple PLDs or macrocells (to applicant's knowledge) that have the capability of generating multiple, time sequenced logic functions on a set of input signals. In other words, a single, simple circuit that generates multiple different boolean logic outputs at different clock cycles could have enormous utility in some applications.

Furthermore, to date no logic device known to applicant performs two different logical functions based solely on the characteristics of the input signals. For example, in some environments it may be useful to have a logic circuit behave in two different ways in response to two sets of logically similar but physically different signals. In other words, a logical "one" can be generated physically by circuit X in the form of a signal having an amplitude I, and by another circuit Y in the form of a signal having an amplitude I/2. If both circuits can transmit their respective outputs to a common, succeeding stage, and if this stage can operate to effectuate two different logical functions (i.e., behave as an AND circuit for the outputs of X, and as an OR circuit for the outputs of Y) then this would further increase the density of an integrated circuit.

SUMMARY OF THE INVENTION

One of the objects of the present invention, therefore, is to provide a new type of electronic logic or logic family that can replace conventional semiconductor FET logic families, and in so doing effectuate new embodiments of common but critical logic circuits that are smaller, faster and more integrated.

Another object of the present invention is to introduce a new type of electronic logic family that has a number of useful characteristics and capabilities, including controlled programmable and re-programmable functionality at the single device level, multiple simultaneous functionality, elementary processing capability, and inherent data output latching.

Another object of the present invention is to introduce new types of logic circuits that are implemented with the aforementioned logic family, including circuits that function as elementary computing machines, massively parallel processing machines, neural network processing machines, and that also have controlled programmable and re-programmable, multiple simultaneous functionality, multiple logic data outputs varying in time, and inherent data output latching.

A first embodiment of the present invention includes a single, novel electronic device as well as a method for operating such device. This new device can operate on digital input logic signals to perform two distinct logic operations, such as an AND function, and an OR function. The input signals are coupled to a configurable magnetoelectronic element, such as a hybrid hall effect element, or a magnetic spin transistor. The magneto-electronic element cooperates to effectuates the logical operation desired, since it has a logic state that is alterable based on the particular values and combinations of input signals. The specific logic operation to be implemented can be controlled in any number of convenient ways depending on the particular needs of the application, including by adjusting the signal characteristics of said input signals, by setting the logic state of the device to an initialization state, or by a control signal input to the device when the digital input signals are applied. The magneto-electronic element has a magnetization state that can be adjusted in different embodiments to be latching or non-latching, again depending on whether it is desirable to store the result of the logic operation. The magneto-electronic element is electrically isolated from other portions of the device, is relatively small (a surface area less than approximately $50\mu^2$) fast (it can change logic states in less than approximately 40 nanoseconds) and durable. This combination of characteristics makes it extremely attractive for use in such logic circuit applications.

As described below, the present invention is extremely advantageous from the perspective of device integration, because the same single physical device can perform a first logic operation on data signals during a first time period, and a second, different logic operation on a different set of signals during a second time period. The particular logic operation to be performed can be programmed ahead of time, or dynamically as part of the data inputs presented to the device to be operated upon. In this manner, a logic gate constructed in accordance with the present invention essentially behaves as two separate prior art logic gates, since from the perspective of other circuits in a system, the novel logic gate can perform two different boolean functions. Thus, when receiving inputs from a first logic circuit, the present device can implement a first logic operation, and when receiving inputs from a second logic circuit, the present invention can effectuate a second, distinct logic operation.

A further embodiment of the present invention includes a circuit (as well as method of operating such circuit) comprised of a group of N (N>=2) separate but interconnected magneto-electronic elements that are coupled to each other and to a set of data inputs for achieving any one of M distinct logic operations. Again, the particular one of the M functions to be performed can be controlled by adjusting the signal characteristics of the input signals, by setting the logic state of the N elements to some initialization state, or by supplying appropriate control signals to the N elements when the digital input signals are applied. Because of the power and flexibility of the present logic gates, the ratio of M/N is substantially larger than that achievable with prior art devices.

In a further embodiment utilizing this useful aspect of the present invention, a boolean function unit can be constructed using only 4 total physical elements.

As further disclosed herein, practical logic circuit embodiments with M/N ratios varying from ½ to 2.5 can be constructed to accomplish a variety of useful functions. For example, a logic circuit which generates different logical operations at different times is disclosed. And, as with the single device embodiments, such circuits comprised of N logic gates can be programmed to perform one set of M operations at one time, and a second set of M' different operations at a later time.

In yet another embodiment, the present invention provides a simple but fast and efficient magneto-electronic processor. A single magneto-electronic element can be programmed specifically to perform either a first or second logical operation on a series of input operands by providing a logical operator in conjuction with such operands. In this manner, a powerful and flexible building block is also achieved for creating larger groupings of such elements in higher functioning systems.

DETAILED DESCRIPTION OF THE INVENTION

Background of ME Devices & General Latching Embodiment

Figure 1:
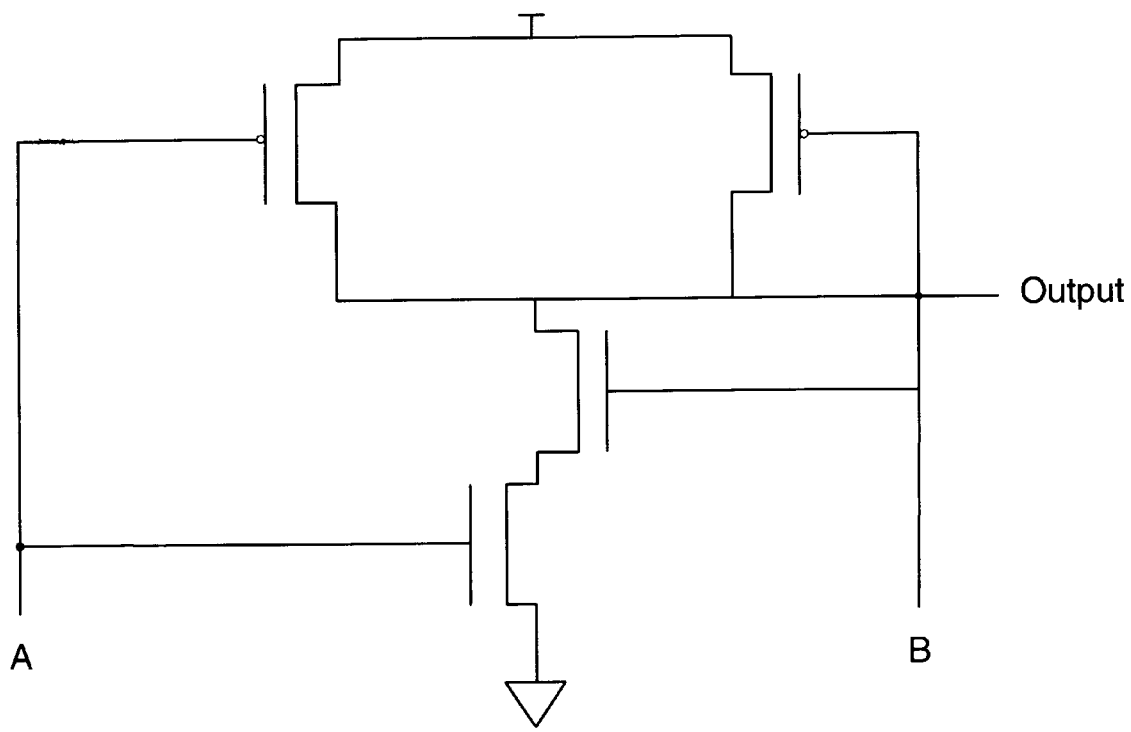
FIG. 1 is a circuit diagram of a NAND logic gate consisting of conventional semiconductor FETs.
Figure 1A:
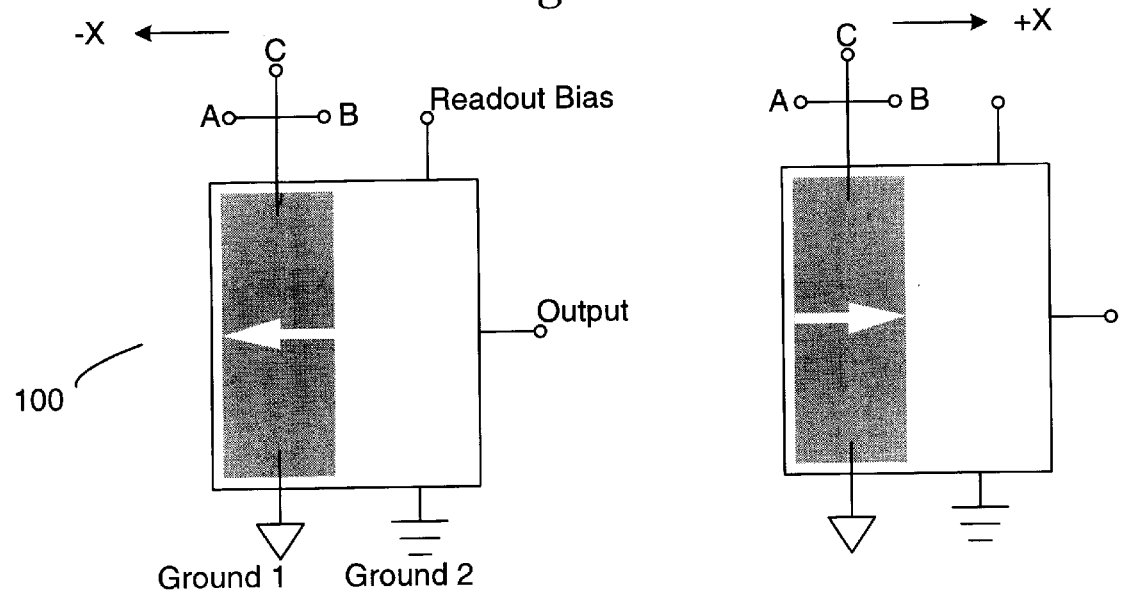
FIGS. 1A–1C are block diagram depictions of the structure and operation of a magneto-electronic logic gate used in the present invention.

For ease of understanding, the present disclosure introduces some shorthand graphical notations and definitions of the ME devices previously discussed at length in my prior patents. For example, FIG. 1A shows a general shorthand schematic depiction of a ME device 100; it could be a Magnetic Spin Transistor (MST), a Hybrid Hall Device (HHD) or similar magneto-electronic device. This nomenclature is used throughout the present disclosure and unless otherwise stated, the ME devices described herein generally utilize this same basic structure. In it simplest form, ME device 100 is considered to be an N state device, with the state determined by the orientation of the magnetization of a ferromagnetic layer F (indicated in shaded form in the figure). In a typical 2 state implementation, and using convenient notation, the magnetization state M of this layer can be left (along $-\hat{x}$) as shown in the left side of FIG. 1A, or right (along $+\hat{x}$) as shown by the arrow in the right side of FIG. 1A. The orientation (state) can be set by using the magnetic field from short current pulses that are generally referred to as write pulses, $I_W$. In a preferred physical implementation a write wire is contiguous with F, typically passing directly over F, and is grounded at a point designated ground 1. As shown here, a positive polarity write pulse (of appropriate magnitude) orients M to the right and a negative polarity write pulse orients M to the left. There can be a number of input terminals to the device, determined as the number of input terminals connected to the write wire (or parallel write wires). For binary operations, one typically uses two inputs labelled A and B, and it will be useful to generalize to the case of a third terminal, a control terminal, C. The right hand side of FIG. 1A demonstrates the result of application of a positive write pulse $+I_W$ to any of the terminals A, B or C of the device configuration shown in the left hand side of FIG. 1A; the state is changed from "left" to "right."

Figure 1B:
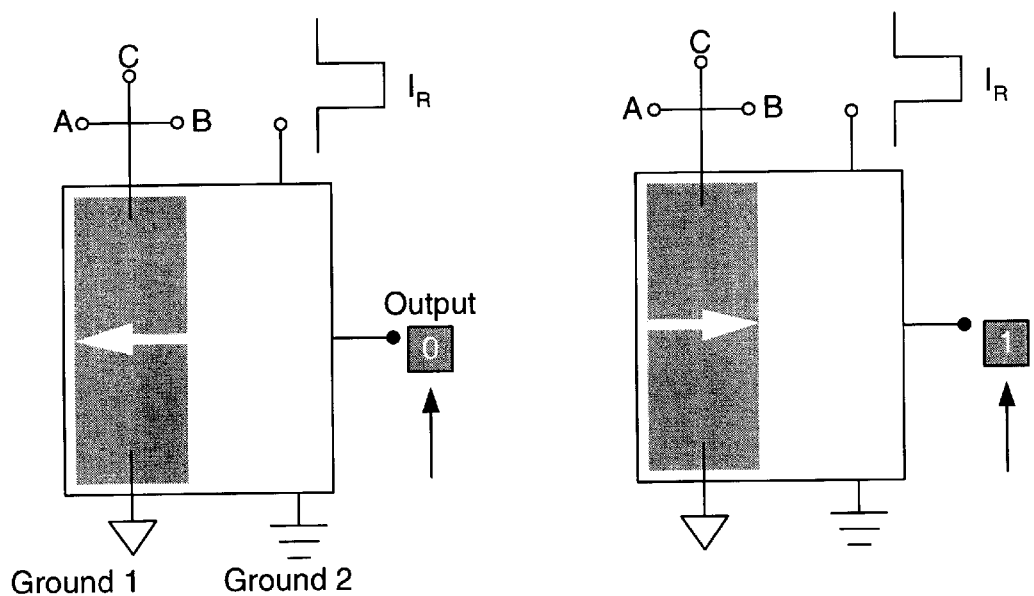

Looking next at FIG. 1B, the device state (which can be considered in a logical sense to be left or right, negative or positive, "0" or "1") can be read out electrically by applying a current bias pulse $I_R$ electrically (a read pulse) to a readout bias terminal. The bias pulse is grounded at ground 2, which may be identical with ground 1 or, most generally, is separate. When a positive polarity read pulse is applied to the readout terminal a voltage is developed at the readout (output) terminal, for the time duration of the bias pulse. For magnetization to the left (left side of FIG. 1B), the readout voltage is intrinsically negative, but the device can incorporate a resistive offset to make the output zero (LOW, denoted by a zero). For magnetization to the right (right side of FIG. 1B), the readout voltage is intrinsically positive, and the incorporation of a resistive offset will make the output positive with twice the intrinsic value (HIGH, denoted by a "1").

Figure 1C:
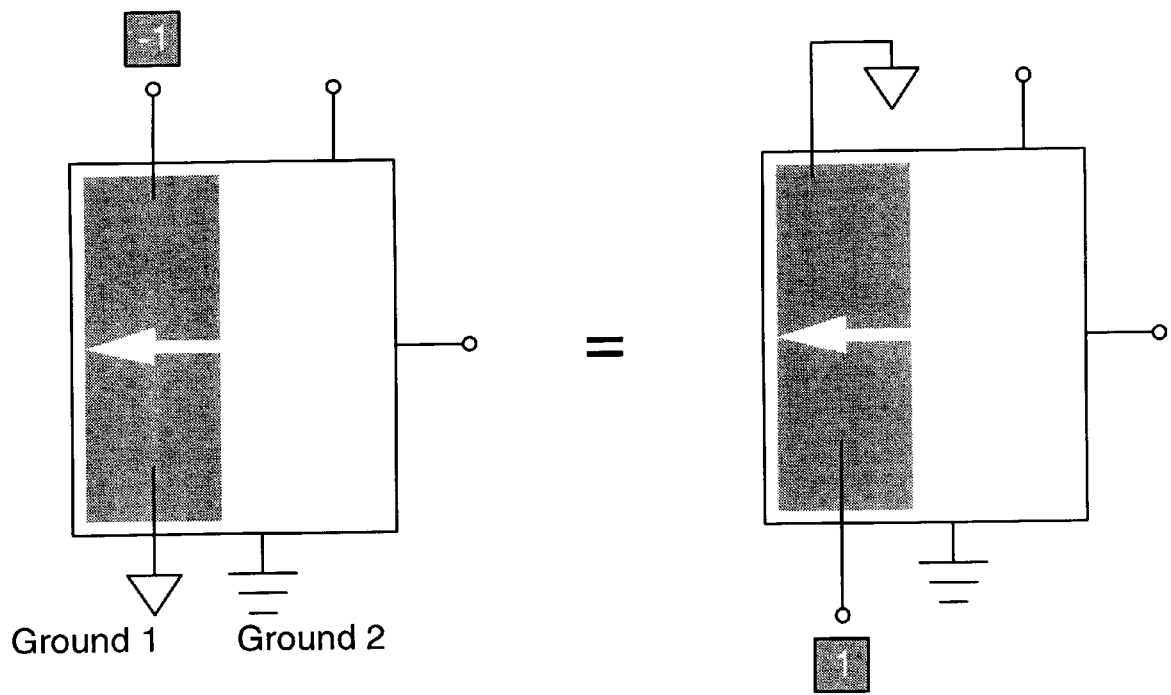

It is also well-known that the write wire can also be inverted geometrically (as shown in the right hand side of FIG. 1C), in which case a positive polarity write pulse (of appropriate magnitude) orients M to the left and a negative polarity write pulse orients M to the right. An identical effect could be achieved by using the original (non-inverted) write line structure (left hand side of FIG. 1C) with opposite polarity write pulses: in other words, a non-inverted structure with a negative write pulse can achieve the same result as an inverted structure with a positive polarity write pulse. In some instances it may be desirable to include both kinds of write layers coupled to the device as a means of avoiding the generation of negative current pulses. FIG. 1C represents the device configuration after transmission of the indicated write pulses.

It is also known, as explained in detail in my prior applications, that the ME devices include inherent beneficial latching and non-volatile features. This is because the magnetic orientation of F is bistable: once in a left or right orientation, the magnetization remains in that orientation (i.e., is non-volatile) until altered by a suitable field from a write pulse. Operation of the ME device as a simple latching gate can be described with the hysteresis loop and pulse sequence of FIG. 2A. Referring to the hysteresis loop, the horizontal axis is applied (external) magnetic field H. This is directly related to a write current $I_W$, of course, by inductive coupling. A write current of unit amplitude (a "1") provides half the required magnetic field to switch the state of F. In other words, the coercivity of F, $H_c$, corresponds to slightly less than twice the unit write current. The vertical axis shows the magnetic state of F as well as a voltage output $V_{out}$, when the device is biased with a read pulse. Again, it is an easy matter to ensure that the output is offset to give output states of logical zero or one; ("0" or "1" LOW or HIGH).

The ME device 100 of the present invention operates as a latching logic gate, and its operation or function can be determined by suitable selection of a control input supplied to terminal C as explained immediately below and as elaborated in more detail later in this disclosure. Operation of an AND gate is described by the pulse sequences in FIG. 2(b). First, a pulse of magnitude and polarity −2 is applied to C during clock cycle 1 to set the magnetization orientation to the left (i.e., the device is put into the "0" state). Clock circuits capable of generating clock signals of arbitrary frequency are well-known in the art, and any number of implementations can be used with the present invention to generate control signal C and other similar signals below. At clock cycle 2, when operand signals A and B are applied, it can be seen now that in the case where at most only one of binary inputs A and B have a value of 1 (the first example is the top portion of 0.2A and shows a value of 1 and 0 respectively) a single pulse of magnitude 1 is not sufficient to reorient M, so the result of the operation is "latched" and stored as the orientation state of F. In this case, however, the magnetization orientation is unchanged and is still oriented to the left (the magnetization state is shown, as a function of time, at far right) as it should be, corresponding to a logical 0. At any later time (e.g. clock cycle 3), the result of the operation (the latched state of the gate) can be read out by the application of a read pulse.

Figure 2A:
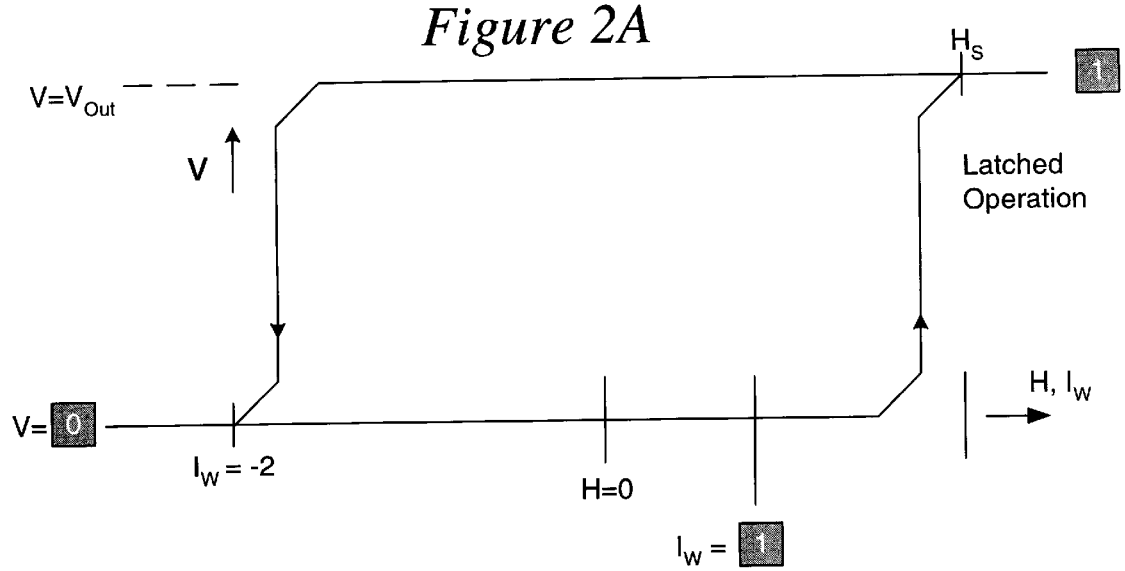
FIG. 2A is a state diagram illustrating the hysteresis relationship between a magnetization state of a latching magneto-electronic AND logic gate, a read-out voltage that correlates with such state, and a magnetic field H applied to such gate.
Figure 2B:
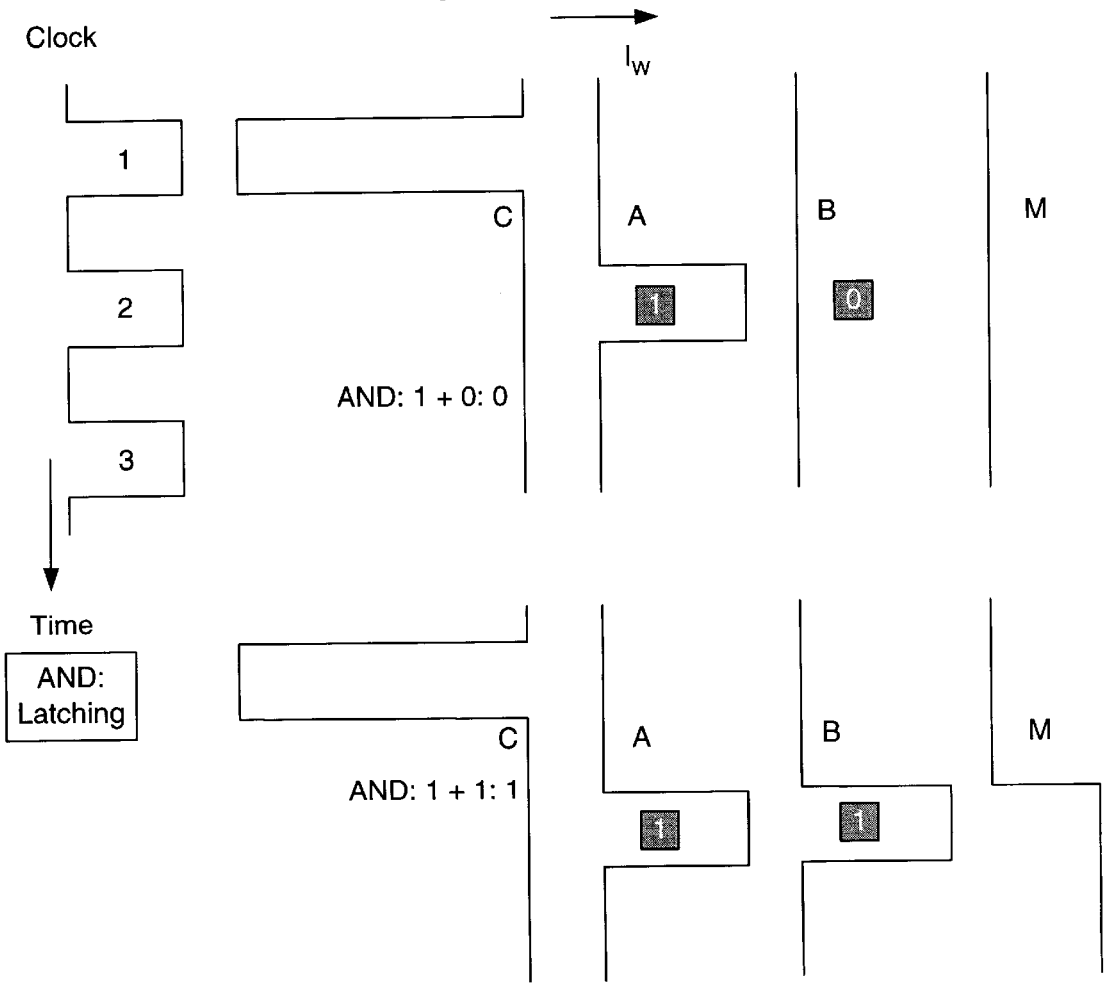
FIG. 2B is a timing diagram illustrating how a magneto-electronic gate of the present invention can be programmed by a control signal C to function as a data latching AND gate for two data input signals A and B.

In the second example (bottom portion of FIG. 2A) of the binary inputs A and B both having a value of 1, this input condition generates a field large enough to reverse the orientation of M (to the right, "1") and this state is latched as shown in the far right hand side of FIGS. 2A and 2B. Again, at any later time the result of the operation can be read out by application of a read pulse.

Figure 3A:
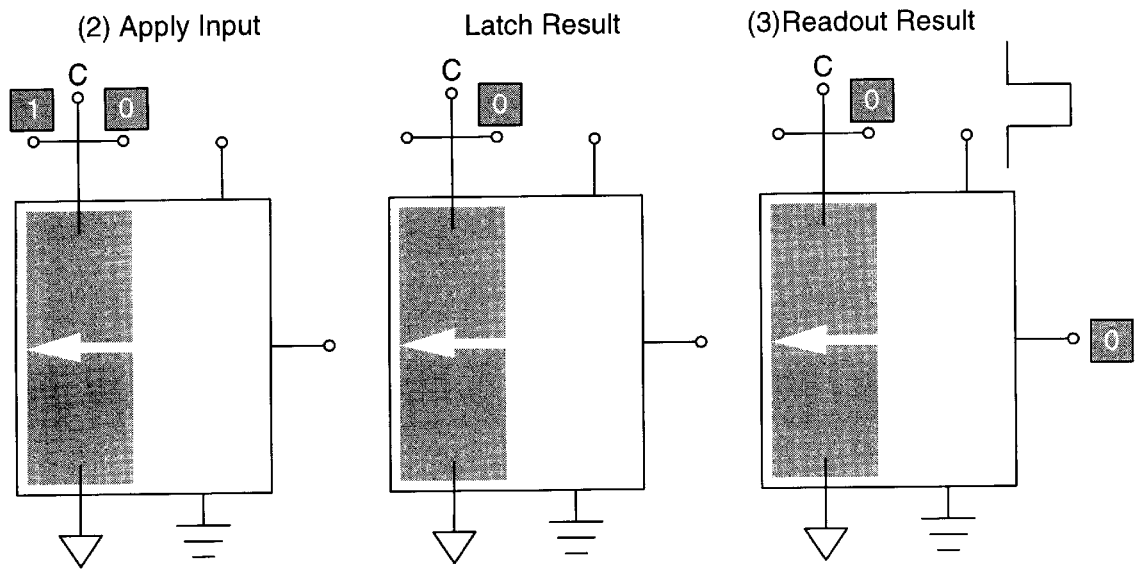
FIGS. 3A and 3B are block diagram depictions of the operation of the magneto-electronic logic gate functioning as a data latching AND gate for two data input signals A and B.
Figure 3B:
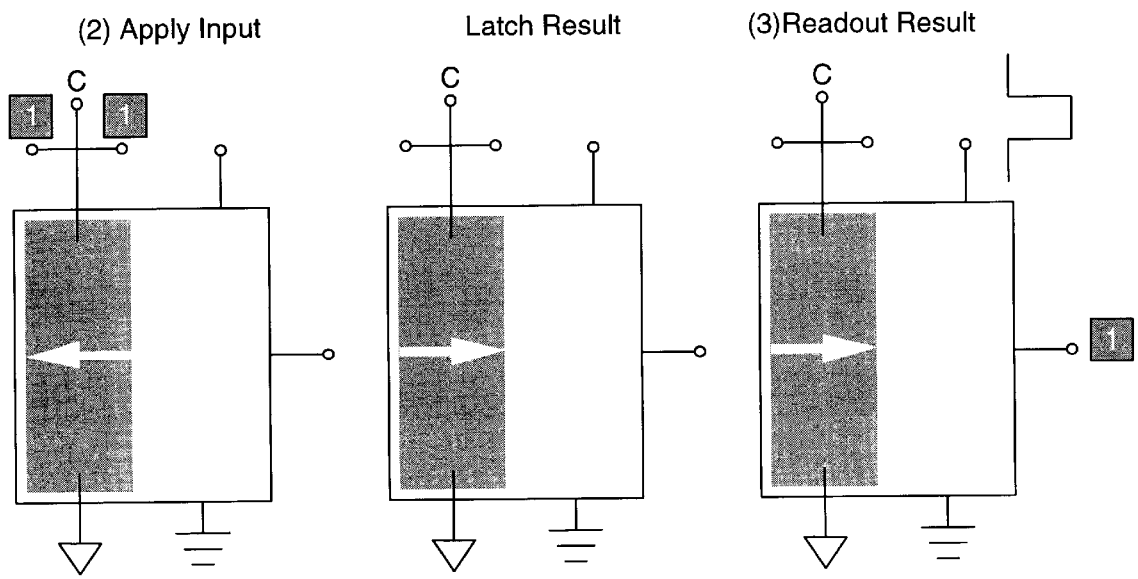

The same operation is depicted in FIGS. 3A and 3B in more graphical form. FIG. 3A depicts the sequence for a combination of input signals corresponding to logical values of A=1, B=0 and FIG. 3B for A=1, B=1. For simplicity, step (1) of setting the device to an initial "0" state is not shown, but the application of the input pulses and latching of the state of the device at step (2) are broken out in two separate phases for clarification. At step (3) the result can be read out as noted above.

Figure 4A:
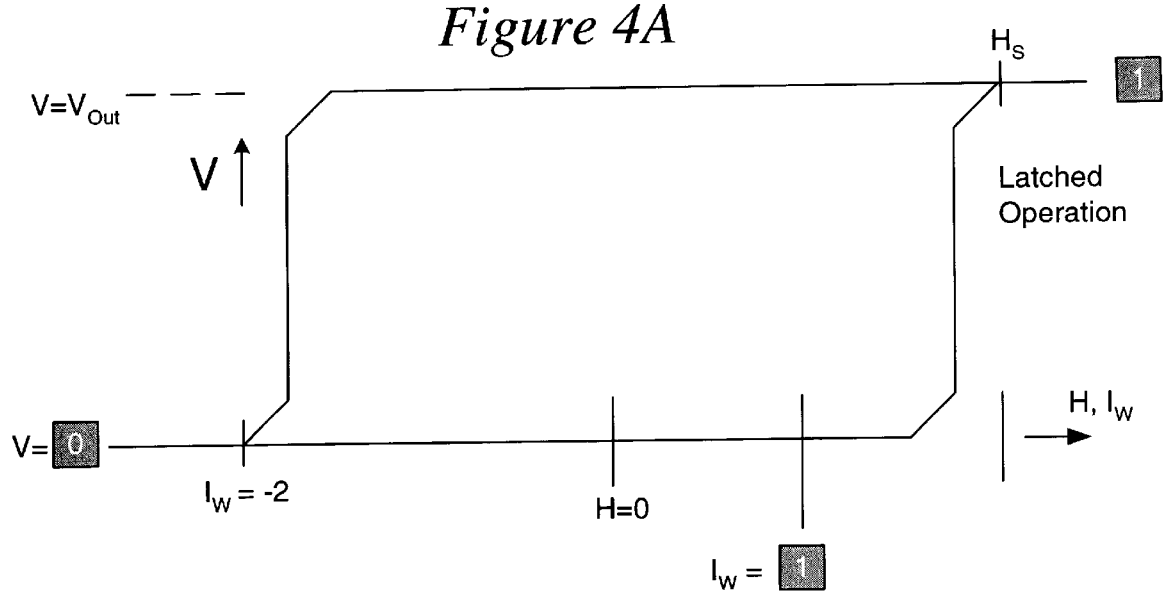
FIG. 4A is a state diagram illustrating the hysteresis relationship between a magnetization state of a latching magneto-electronic logic OR gate, a read-out voltage that correlates with such state, and a magnetic field H applied to such gate.
Figure 4B:
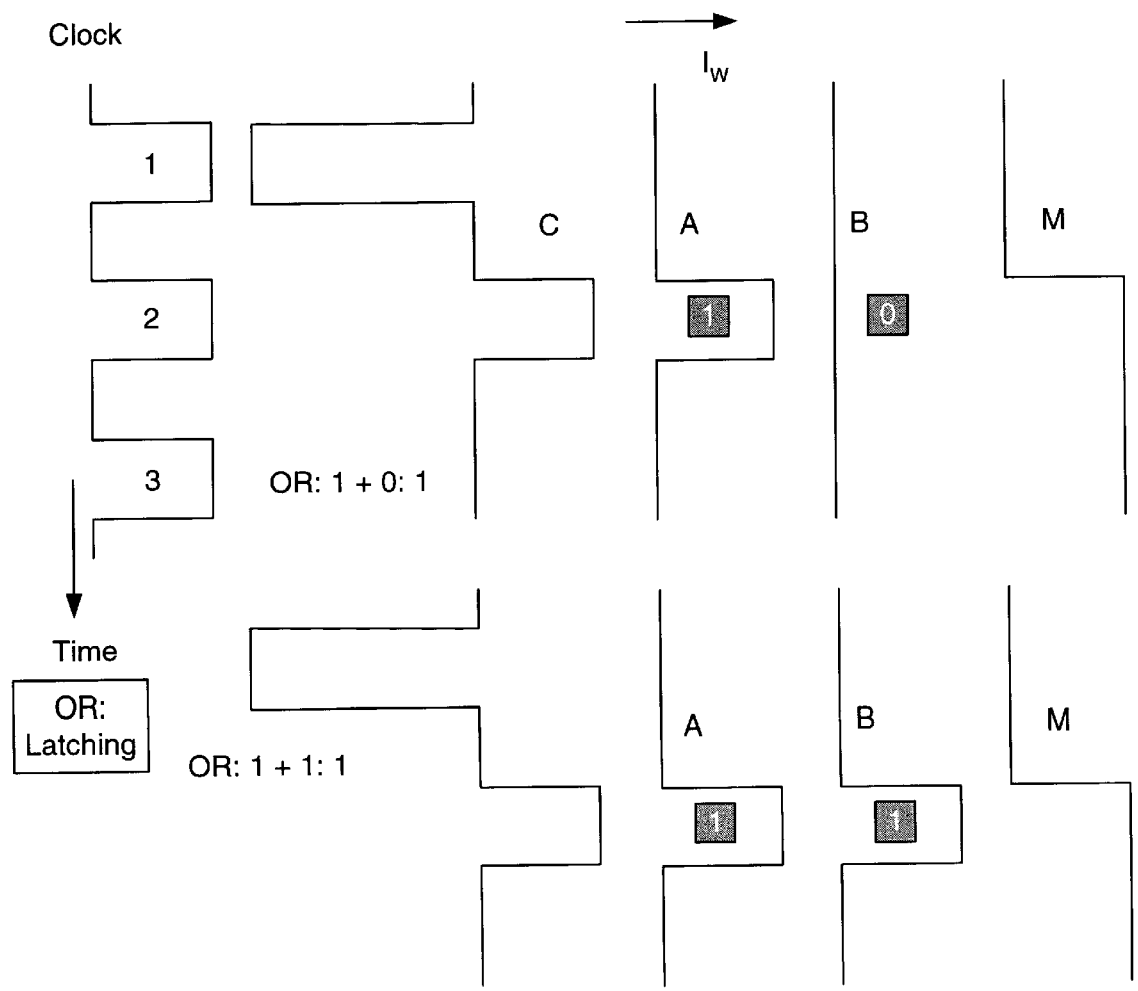
FIG. 4B is a timing diagram illustrating how a magneto-electronic gate of the present invention can be programmed by a control signal C to function as a data latching OR gate for two data input signals A and B.

Operation of the same ME device as an OR gate is described by the pulse sequences in FIGS. 4A and 4B. Again, first a pulse of magnitude and polarity −2 is applied to C to set the magnetization orientation to the left (the device is put into the "0" state). Then a control pulse of unit amplitude is applied to C and simultaneously the binary input current pulses are applied to A and B. The control pulse of magnitude 1 at input C effectively "informs" the gate that it will function as an OR gate, just as a control pulse of magnitude 0 "informed" the gate that it would function as an AND gate. A single input pulse of magnitude 1 for either of inputs A and B, in addition to the control pulse of magnitude 1, is adequate to reorient M to the right. The result of the operation is again latched for readout at any later time.

As is apparent, in the second example of the binary inputs having values 1+1, two input pulses of magnitude 1 in addition to the control input pulse of magnitude 1 are again adequate to reorient M to the right, and the result is latched for later readout.

So far it is clear that a single ME structure can be used as an OR gate or an AND gate, using a control pulse to "inform" the device of its function. Similarly, a single ME with inverted structure could be used as a NOR gate or a NAND gate. Alternatively, the original ME could be used as a NOR gate or a NAND gate if the polarities of the input current pulses were reversed.

It's worth noting at this point that ME devices use current pulses as signals and to control states, whereas traditional semiconductor digital electronics uses voltage pulses. Consequently, it will be understood by those skilled in the art that mixing and merging ME devices with SDE in the same application would require various forms of signal adjustment circuitry well known in the art, in a similar manner to that previously done for mixed process technologies such as CMOS, TTL, RTL, ECL, etc. For example, SDE environments provide calibrated voltage levels, such as $V_{DD}$ and $V_{SS}$. A current of desired value for driving devices of the present invention in such environment nevertheless can be delivered by choosing appropriate impedance for the write wire layers, and in most such cases currents applied to terminals on a single write line will sum because the impedances merely add in parallel. Other cases may require a different approach than that proposed here, but the precise implementation of such schemes is not critical and is believed to be application specific.

Non-Latching ME Embodiment

The ME devices described above, which include a latching function, have the advantage of automatic storage of the final result, but may be unattractive in some applications since a negative current (and therefore voltage) source may be required on the chip. While similar features are known and effectuated by charge pump circuits and the like in connection with Flash memories, this requirement can be avoided by using a new non-latching type ME device described herein for the first time.

Figure 5A:
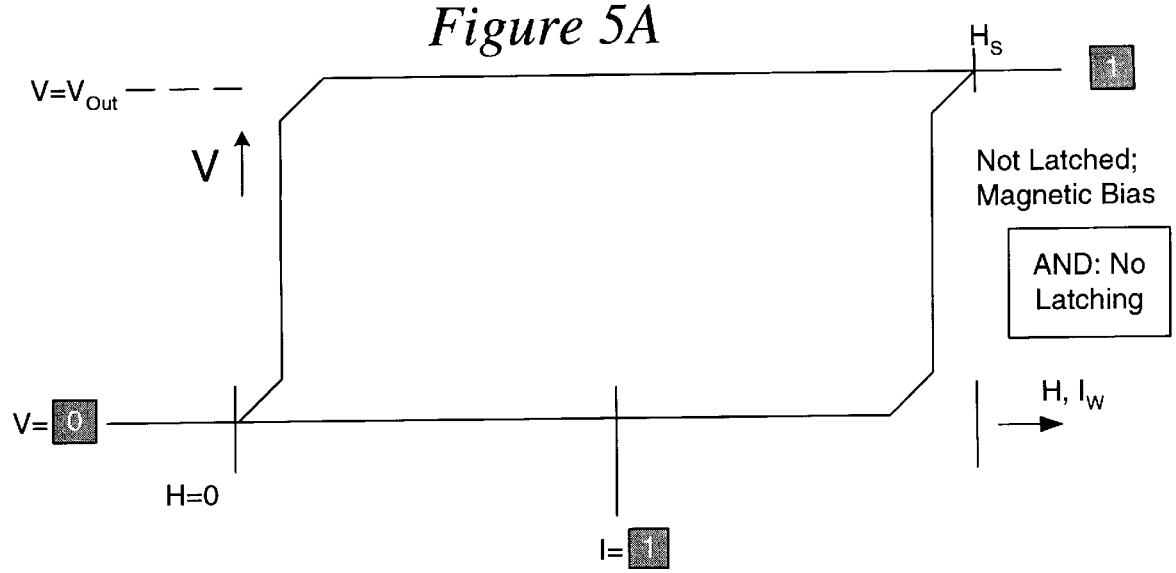
FIG. 5A is a state diagram illustrating the hysteresis relationship between a magnetization state of a non-latching magneto-electronic logic AND gate, a read-out voltage that correlates with such state, and a magnetic field H applied to such gate.
Figure 5B:
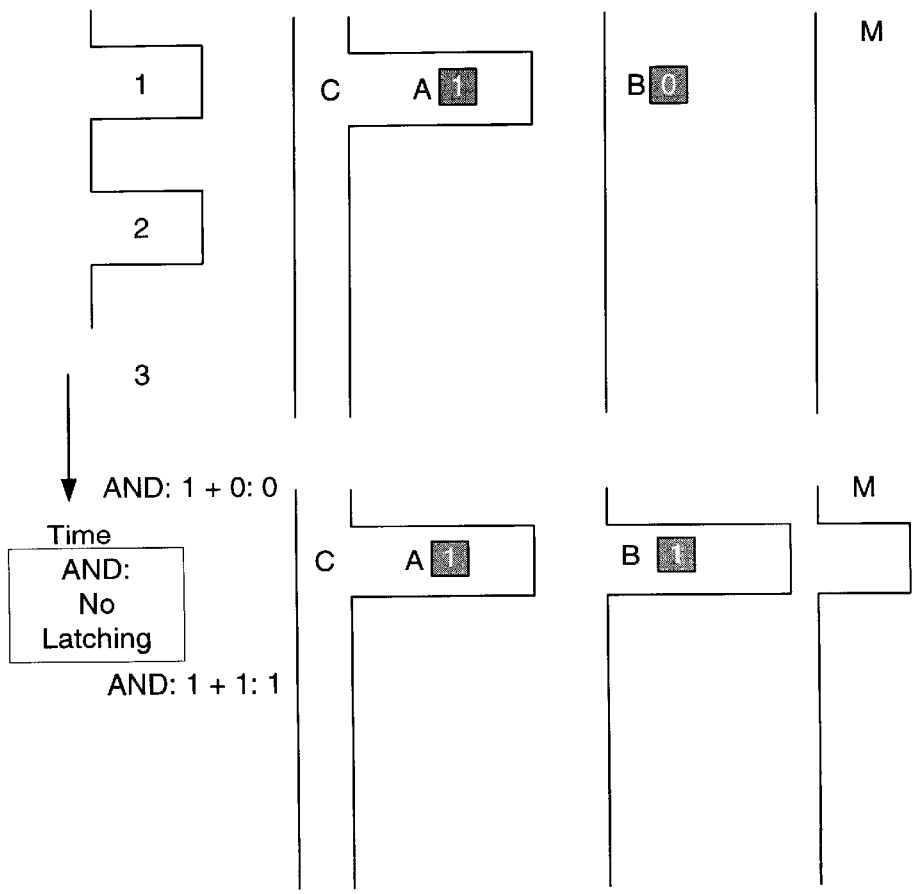
FIG. 5B is a timing diagram illustrating how a magneto-electronic gate of the present invention can be programmed by a control signal C to function as a non-latching AND gate for two data input signals A and B.

In this respect, a description of a non-latching AND gate is given with the aid of FIG. 5. In the magnetization plot of FIG. 5A, the fabrication of F has incorporated a magnetic bias so that the hysteresis loop of F is shifted away from H=0 (equivalently $I_W$=0). The coercivity of F is chosen so that the field associated with a write current amplitude of unity is roughly half the field necessary to flip the magnetization from left (at $I_W$=0) to right. In other words, the coercivity approximately corresponds to a write pulse of amplitude 1. It is apparent that other types of bias may be implemented with the present invention.

In this embodiment, operation of the gate requires fewer steps because it is not necessary to reset the state of the gate to "0" before each operation: the state automatically resets to zero because of the magnetic bias. An AND gate operation is described with the sequence of pulses in FIG. 5B. For the binary logical input combination 1+0 for A and B respectively (top portion of FIG. 5A) if no pulse is applied to C, the single pulse of magnitude 1 is not sufficient to reorient M. The device remains in the logical state 0, as seen at far right. This state can be read out by a read pulse applied substantially simultaneously with the input pulses. For the binary logical input combination 1+1 for A and B (bottom portion of FIG. 5B), two current pulses of magnitude 1 are sufficient to reorient M. As seen at far right, M will orient to the right for the duration of the input pulses; this state can be read out as long as a read pulse is applied substantially simultaneously. In effect, this type of embodiment mimics the behavior of traditional tri-state non-latched semiconductor logic gate circuits in that the outputs of such gates are active only when the inputs are active as well. In practice, a material for F can be chosen such that the magnetic relaxation time is longer than its rise time, in which case the state of the device that results from the input pulses may last slightly longer than the time of the pulses. In this manner, therefore, the timing of the application of the read pulse is not critical to the operation of the present invention.

It will be apparent to those skilled in the art that an OR gate can be constructed from the aforementioned ME device in substantially the same manner as described above. The only major difference is the fact that a control pulse of magnitude 1 is applied to C to "inform" the device that it will function as an OR gate. A single current pulse of magnitude 1 (originating from one or both of the input logical signals A or B) applied to an input terminal is now sufficient, in addition to the control pulse, to reorient M, thus implementing a logical OR function. Furthermore, along the lines of the discussion above, a non-latching device (with appropriate magnetic bias) can be made similarly with an inverted geometry, so that it functions as a NOR or NAND gate.

Detailed Description of Configurable Logic Device Using ME Devices

Figure 6:
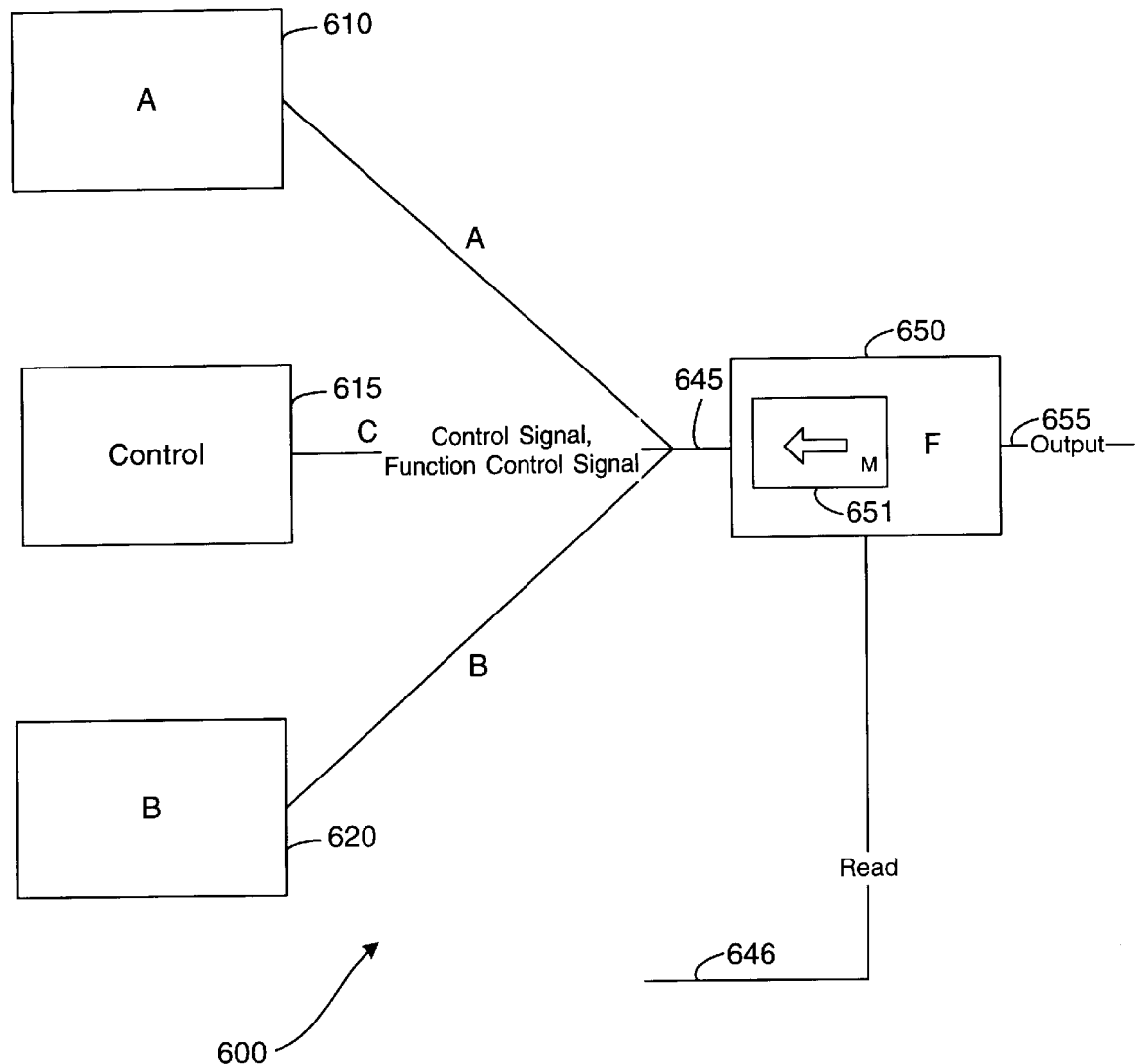
FIG. 6 is a block diagram depiction of a typical structure of a programmable magneto-electronic logic gate circuit implemented with magneto-electronic logic elements of the present invention.

With this basic framework in mind, FIG. 6 depicts in more detail a preferred use of a configurable logic device constructed in accordance with one aspect of the teachings of the present invention. As constituted, such a device can be implemented as a logical functional building block for higher level processing devices, such as microprocessors, digital signal processors, RISC processors, programmable logic, etc. The expression "logic" device, therefore, as used herein is intended in its broadest connotation and intended to include such logical operations, numeric operations, etc. For purposes of simplifying and understanding the more important aspects of the present invention, certain less essential features of the device (such as the grounds for the write wires and for the device itself, the layout of the write layer and read terminal, etc) are omitted from further discussion herein.

As alluded to above, from a high level perspective, the instant embodiment performs a selectable and configurable logic function F (A,B,C) on two or more operands A and B; for example, an AND, OR, NAND or NOR function applied to two binary signals. As explained in detail below, however, this embodiment provides a number of unique logical functions and operational characteristics previously unavailable with conventional semiconductor devices. In particular, the present embodiment permits a logic function F to be controlled based on any or all of the following variables: characteristics of signals A and B; characteristics of control signal C; and/or characteristics of a configuration signal used to set a configuration state M. From the discussion below, it is apparent that the single ME devices can be considered as elementary data processing machines in that they can perform fast logical operations on one or more operands in accordance with the directive of an operator specified at the time of execution of the operation.

As depicted in this figure, operand circuits 610 and 620 generate logical signal outputs A and B respectively. It is understood in FIG. 6 that operand circuits 610 and 620 may constitute one or more ME devices of the type described above, and which generate logical signals A and B either directly as outputs or through some intermediary buffering and amplification circuitry. It is not necessary for operand circuits 610 and 620 to be ME devices, of course, but in such configuration, the device integration density can be substantially enhanced.

The output signals of these circuits, as explained earlier, may be any of one of N possible distinct logical levels, but in a preferred embodiment are binary signals embodied in current pulses having either a LOW or HIGH current level, which level is also controllable within each logic circuit 610 and 620. In other words, depending on the desired logical function F, signal A may have a low current level of 0 and a high current level of $+I_W$, and signal B may be independently controlled in a similar manner. Again, these are merely exemplary, and it will be apparent to those skilled in the art that other selections could be used for the value of such signals (i.e., $-I_W$ to $+I_W$, or 0 to $+2 I_W$, 0 to $+(\frac{1}{2})I_W$, etc.) depending on the particular requirements.

In a preferred embodiment, Function circuit 650 is also a single magneto-electronic device of the type described above, i.e., a hybrid hall effect device or a spin transistor device. Other suitable magneto-electronic devices for some applications may include those based on magneto-resistance, giant magneto-resistance, magneto-resistive tunnel junctions, magnetically controlled superconducting switches, etc. It can be seen rather plainly that the selection of the output range for signals A and B can determine the logical function F(A, B, C) performed by Function circuit 650.

For example (and assuming control signal C is disabled so that its independent effects can be disregarded) assume that it is desired for logic function F(A, B, C) to effectuate a Boolean AND operation on signals A and B. For purposes of isolating and observing this particular unique quality of the present invention, assume also that a function configuration signal 645 has not disturbed an initial state set at an earlier time in a configurable portion 651 of Function circuit 650, and that such initial state M is already configured as a magnetization orientation pointing to the left as shown. For purposes of this example, initial state M can be considered as in a negative state $(-M_I)$ pointing to the left, and in a positive state $(+M_I)$ when it is pointing to the right. Again, in a preferred embodiment, configurable portion 651 represents a ferromagnetic layer associated with a hall effect device, a magnetic spin transistor, or some other device with configurable states, including but not limited to the other magneto-electronic devices mentioned above. As is known in the art, and as described in detail in my prior patents, in such an orientation state, current level values $+I_W$ of A and B can be suitably chosen so that when they are combined on an input signal line to function circuit 650, such combined signal (A+B) contains sufficient current to generate a field H large enough $(H>H_s)$ to alter (flip or switch) the initial magnetization state M (which is set to $-M_I$) only when both signals are at a logical level "high" (i.e., $+I_W$). Here $H_S$ is defined as the "switching field," the scalar value of a magnetic field required to flip the magnetization state M [FIG. 2A]. In this way, function circuit 650 operates as an AND gate, because it will only change its initial state from left $(-M_I)$ to right $(+M_I)$ in response to two high level signal inputs from A and B.

If under the same operating conditions, however, operand circuits 610 and 620 instead generate output signals A and B with high logical values equal to $+2I_W$, it can be seen that the function F(A, B,C) performed by function circuit 650 is that of a Boolean OR operation instead. This can be seen in the following two tables (where M is set to the left $(-M_I)$ for the initial state of the device):

TABLE 1

Control of function F(A,B,C) of Function Circuit 650 to perform AND operation based on First Output Level for Operands A and B

| Signal A | Signal B | Combined Magnetic Field from A + B | Resulting Configured State M | Output of Function circuit 650 (configured pointing to left initially) |
|---|---|---|---|---|
| 0 | 0 | 0 | $-M_I$ | 0 |
| 0 | $1/2 + I_W$ | $1/2\ H_S$ | $-M_I$ | 0 |
| $1/2 + I_W$ | 0 | $1/2\ H_S$ | $-M_I$ | 0 |
| $1/2 + I_W$ | $1/2 + I_W$ | $H_S$ | $+M_I$ | 1 F(A,B,C) performs AND operation |

TABLE 2

Control of function F(A,B,C) of Function circuit 650 to perform OR operation based on Second Output Level for Operands A and B

| Signal A | Signal B | Combined Magnetic Field from A + B | Resulting Configured State M | Output of Function Block 650 (configured pointing to left initially) |
|---|---|---|---|---|
| 0 | 0 | 0 | $-M_I$ | 0 |
| 0 | $+I_W$ | $H_S$ | $+M_I$ | 1 |
| $+I_W$ | 0 | $H_S$ | $+M_I$ | 1 |
| $+I_W$ | $+I_W$ | $2H_S$ | $+M_I$ | 1 F(A,B,C) performs OR operation |

In other words, the selection of the input signals characteristics alone can determine the logical function performed by function circuit 650. Stated from another perspective, a single physical magneto-electronic device in function circuit 650 performs two different functions simultaneously and without any assistance or adjustment from other circuitry.

The applicant believes that this "transformation" feature of the present invention is extremely beneficial and useful in a number of contexts, and that such approach is likely to be adopted in a number of environments where it is important to obtain the most functionality from a single collection of electronic circuits.

Control circuit 615 generates a configuration signal (a control signal) C, which signal is generally unrelated to operand signals A and B, but of course could constitute another logical operand to be operated on by function F(A,B,C) in block 650. As with output signals A and B, output signal C can be generated by another stage of ME devices, another logical circuit, etc., and can have a range of logical values similar to those for A and B. In a preferred embodiment, the output C of Control circuit 615 is in turn selectably configured or determined as necessary by additional processing logic (not shown) which operates also to determine the nature of function F(A,B,C) performed by function circuit 650. This control may be in lieu of, or in combination with, the signal output control that can be effectuated by selection of signal levels for signals A and B above.

Control signal C can also determine the nature of the logic function F(A,B,C) performed by function circuit 650 in the following manner. Assume that signals A, B and C are configured to have signal levels ranging from 0 (logical zero) to $+I_W$ (logical one), and that an initial state M of function circuit 650 is again set to a magnetization orientation pointing to the left ($-M_I$) as above. If Control circuit 615 is enabled along with the outputs for operand blocks 610 and 620, such outputs will be combined as A+B+C at the input to Function circuit 650. If the output of C is set to a logical 0, it does not contribute to the input signal, and it is apparent that operation F(A,B,C) is a logical AND as above. If, however, output C is set to a logical 1 instead, it will combine with A+B and in effect transform Function circuit 650 into an OR gate instead. Again, this can be seen from the following two tables:

TABLE 3

Control of function F(A,B,C) of Function circuit 650 to perform AND operation based on First Value of Control Signal C

| Signal A | Signal B | Signal C | Combined Magnetic Field from A + B + C | Resulting Configured State | Output of Function circuit 650 (configured to point to left) |
|---|---|---|---|---|---|
| 0 | 0 | 0 | 0 | $-M_I$ | 0 |
| 0 | $+1/2 I_W$ | 0 | $1/2\ H_S$ | $-M_I$ | 0 |
| $+1/2 I_W$ | 0 | 0 | $1/2\ H_S$ | $-M_I$ | 0 |
| $+1/2 I_W$ | $+1/2 I_W$ | 0 | $H_S$ | $+M_I$ | 1 |
| | | | | | F(A,B,C) performs AND operation |

TABLE 4

Control of function F(A,B,C) of Function circuit 650 to perform OR operation based on Second Value of Control Signal C

| Signal A | Signal B | Signal C | Combined Magnetic Field from A + B + C | Resulting Configured State | Output of Function circuit 650 (configured to point to left) |
|---|---|---|---|---|---|
| 0 | 0 | $+1/2 I_W$ | $1/2\ H_S$ | $-M_I$ | 0 |
| 0 | $+1/2 I_W$ | $+1/2 I_W$ | $H_S$ | $+M_I$ | 1 |
| $+1/2 I_W$ | 0 | $+1/2 I_W$ | $H_S$ | $+M_I$ | 1 |
| $+1/2 I_W$ | $+1/2 I_W$ | $+1/2 I_W$ | $3/2\ H_S$ | $+M_I$ | 1 |
| | | | | | F(A,B,C) performs OR operation |

It can be seen rather clearly now that function circuit configuration signal from Control circuit 615 can also control the nature of the function F(A,B,C) performed by Function circuit 650, and essentially behaves as an "operator" with respect to input signals A and B. For example, assume that an initial state M in portion 651 of function circuit 650 can be set to any one of N distinct magnetization orientation states. For N=2, the operation of the device is as shown above. If, however, the device is initially set to an initial setting to the right (instead of to the left) using a large positive pulse (instead of a large negative pulse), and the input signals A, B and C have their polarities reversed, then the device will behave as a NOR gate or NAND gate as the case may be.

Another significant advantage of the magnetoelectronic devices of the present invention lies in the fact that they retain (latch) the result of any operation they perform. In this manner, they act as both logic gate and (readable) latch, so that a read (clock) signal 646 can be applied to Function circuit 650 to determine the result of the functional operation effectuated on logical signals A and B. Alternatively, in some embodiments where a latching function is not required (as explained above), read signal 646 can be applied coincident (or substantially simultaneously) with the input signals, and the initial state M of Function circuit 650 can be toggled between two magnetization states. In this way, and assuming that F(A,B,C) performs an AND operation, the presence of logical 1 values for both A and B will cause M to transition from an initial left state $-M_I$ (0 or LOW) to a higher state right $+M_I$ (1 or HIGH), but only for a brief period of time. In this manner, a logical propagating "pulse" output can be generated based on the change in the state of the device, much in the same way typical FET logic devices work in conventional semiconductor circuits. Finally, to control signal propagation timing to subsequent logic stages in a predictable manner, a delay line can be used as well between stages.

The examples above are merely illustrative of the general principles inherent in the teachings of the present invention. Other variations will be apparent to skilled artisans, and the present invention is by no means restricted to such embodiments and examples.

The embodiment of FIG. 6, including specifically, the configurable Function circuit 650 is unlike any other prior art electronic circuit known to the applicant. This logic device includes a number of functionalities that are extremely useful but cannot be implemented in conventional semiconductor devices, including the following:

(1) A single electronic device constructed in accordance with the present invention can implement more than one logical function, controllable as needed, thus significantly reducing duplicative, unnecessary circuitry logic, and correspondingly increasing logical integration density of a logic circuit. In contrast, in conventional semiconductor gate logic, a single FET is not capable of performing even one logical function, let alone two. Moreover, a series of FETs interconnected to perform an AND function on two input signals cannot perform any other function. A larger set of FETs can be interconnected to perform two different functions, but this requires additional active devices, interconnects, power, etc., which is unattractive as a long term solution to increasing the functional density of integrated circuits.

(2) The logical function to be performed at any instant in time by an electronic device implemented using the present invention can be selected by any number of different and independent degrees of freedom of control, including either through a different selection of input signals, control signals, and/or configuration signals.

(3) The present invention permits a device to be reconfigured to perform a different function instantaneously, or at the least, with a very fast switch of the initial configuration state M. This also contrasts with prior art systems, where, for example, a programmable block of logic in a programmable logic device may take several hundred milliseconds to reprogram.

(4) The present invention permits configurable control of a logical function at a granular level heretofore unavailable: i.e., the single device stage. The prior art permits some re-configuration of logic circuit functions, but only at a very high level: i.e. a programmable cell usually includes a collection of gates, which in turn represents dozens of active FET devices.

(5) Since a single ME device of the present invention can perform several different functions, thus replacing a much larger number of traditional FETs, the number of required interconnects is reduced even more significantly. This alleviates another known factor limiting device and functional density.

(6) A single electronic device constructed in accordance with the present teachings can be multi-tasking in that it can be connected to and shared by a number of different prior logic stages, and behave as necessary (i.e., implement the needed function required by such prior stage) for each of such stages. Again, it is relatively difficult (if not impossible) to connect a single logic stage as part of more than one logical processing block at the same time using conventional semiconductor devices without complicated clock logic.

(7) The ME devices of the present invention behave as and constitute elementary logic processors or processing machines operating on a granular level hitherto unknown. In traditional micro-computing architectures an "instruction" to be executed typically includes an operator and one or more specified n bit operands. In a similar fashion, the present ME devices accept inputs that can be considered as including a logical operator (control signal C) and one or more operands (input signals A and B). Since the resulting function effectuated is based on signals A, B and C, the present devices can be essentially considered as fine grained primitive or elementary data processing machines.

Boolean Function Unit Embodiments

As mentioned earlier, the non-latching operation for ME devices more closely parallels the gate operation descriptions of SDE. In particular, inputs of a single polarity, 0 or 1 ($V_{SS}$ and $V_{DD}$), are required (in contrast with latching operation, which may require both polarities in some circumstances) and the output states are 0 or 1. It should be remembered that the ME device impedance is typically smaller than that of SDE devices, and the output states are typically less than CMOS levels. However, the levels are likely to be the order of 0.1 V, large enough to set the state of a FET, so the output levels can be easily set to CMOS levels by buffering the output in a number of well-known ways.

Figures 7A, 7B:
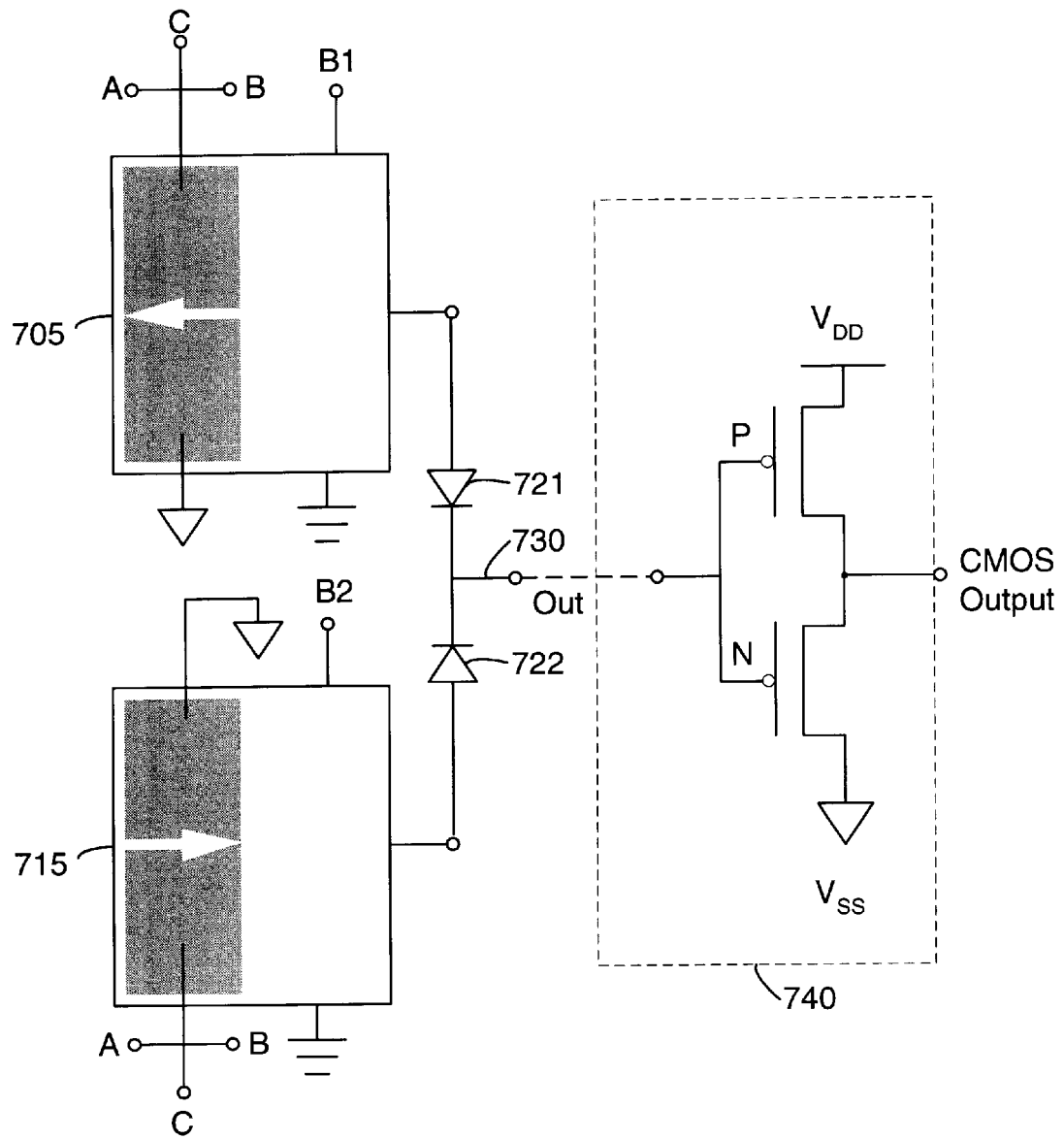
FIG. 7A is a block diagram depiction of a first embodiment of a multi-function logic unit implemented with magneto-electronic logic elements of the present invention and optional conventional semiconductor driving elements.
FIG. 7B is a logic signal table correlating the logic functions performed by the circuit depicted in FIG. 7A for any combination of control inputs.

A Boolean function unit (BFU) is now described in FIG. 7A with reference to the non-latching ME gates described above. First we note that a parallel combination of a single ME device 705 and a single inverted ME device 715 can operate to effectuate four different logical boolean operations with a single function control input and two read control inputs. Because of the relatively low impedance of the ME device, diodes 721 and 722 are used at the output 730 of each device in a preferred embodiment to prevent dissipation of output voltages through the contiguous device. In practice this can be a Schottky diode, taking up little space; other isolation elements can be used, however, and the invention is by no means restricted to the present embodiment. Given that the output levels of the ME devices are likely to be relatively small, e.g. the order of 0.1 V, a certain degree of amplification may be necessary to make the output signal useful to subsequent stages. In a preferred embodiment a buffered output using a pair of FETs (as shown in the dashed box 740) can easily provide sufficient drive to bring the output level of the ME BFU to CMOS levels. Other possible output amplifying and buffering schemes will be apparent to those skilled in the art.

The table of input values required to effectuate various logical operations is given in FIG. 7B. It can be seen, for example, that if control signal C is set high (C=1), and only signal B2 is activated (B1=0, B2=1), the BFU shown in FIG. 7A implements a NOR function. The other functions (AND, OR and NAND) achieved by the BFU are easily determined from the table of FIG. 7B with reference to the circuit shown in FIG. 7A.

Figures 8A, 8B, 8C:
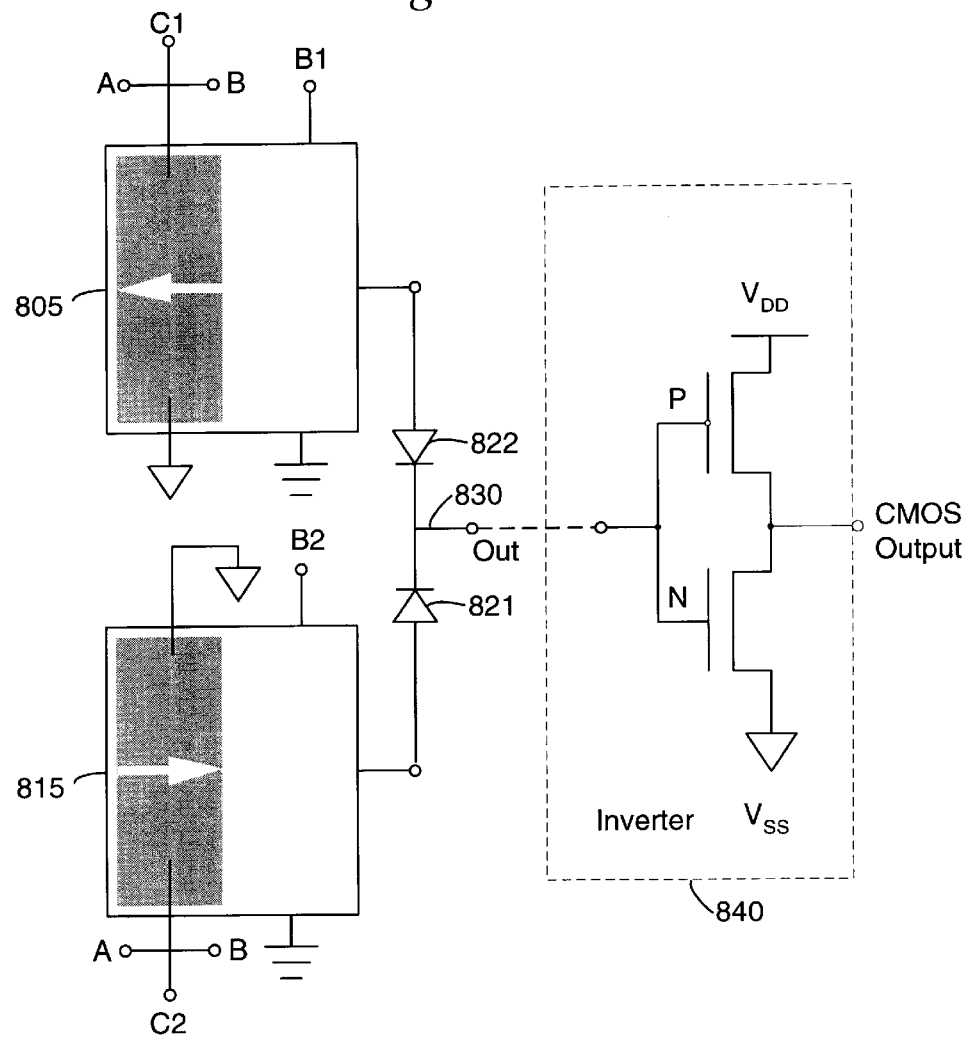
FIG. 8A is a block diagram depiction of a second embodiment of a multi-function logic unit implemented with magneto-electronic logic elements of the present invention and optional conventional semiconductor driving elements.
FIG. 8B is a logic signal table correlating the logic functions performed by the circuit depicted in FIG. 8A for any combination of control inputs taken in combination with an inverted output driver.
FIG. 8C is a logic signal table correlating the logic functions performed by the circuit depicted in FIG. 8A for any combination of control inputs taken in combination with a non-inverted output driver.

The same configuration of two ME devices can be used to generate five unique (separate) boolean functions if two control signals $C_1$ and $C_2$ are implemented, instead of the single control signal as described above. This embodiment is depicted in FIG. 8A. As with the FIG. 7A embodiment, if the output is amplified with an inverting buffer, as shown in the dashed box of FIG. 8A, the BFU operates as NAND, NOR, AND, OR and XOR gates, as described with the left table of FIG. 8B. By comparison, to achieve these same operations, the prior art CMOS BFU Weste described on pp. 306–307 of that reference, utilizes some 16 separate FET elements. In addition, the Weste prior art BFU presumes the existence of both the original and inverted forms of input signals (i.e., A and /A) which is not required in the present invention, and which is known to require an additional two gates to generate (i.e., an inverter). For this reason, the true count of Weste's circuit is more on the order of 20 gates or so. Accordingly, even accounting for additional drive elements (2 FETs) the present ME BFU has at most 4 devices and is therefore occupies a space of ¼ or ⅕ that of conventional devices (assuming equal device sizes).

Furthermore, according to applicant's understanding, the ME BFU not only uses less space, but should be faster.

If instead the output is amplified with a non-inverting buffer, the BFU of FIG. 8A operates as an AND, OR, NAND, NOR and XNOR gates [right table of FIG. 8C]. In the event a BFU is required that performs 6 functions (i.e. including both XOR and XNOR) one or more different options can be pursued. One can add ME devices in a new configuration, or one can use the configuration of FIG. 8A with two output buffers, one inverting and one non-inverting, and create a BFU with one output for F(A,B) and a second output for −F(A,B). This kind of BFU is also described in Weste, and would cost at most another 2 or so FET elements to implement. In any event, the example of FIG. 8A makes it clear that ME BFUs can be made using as little as ¼ the number of devices as a SDE BFU, and using the lowest level of ME architecture.

Figures 9A, 9B:
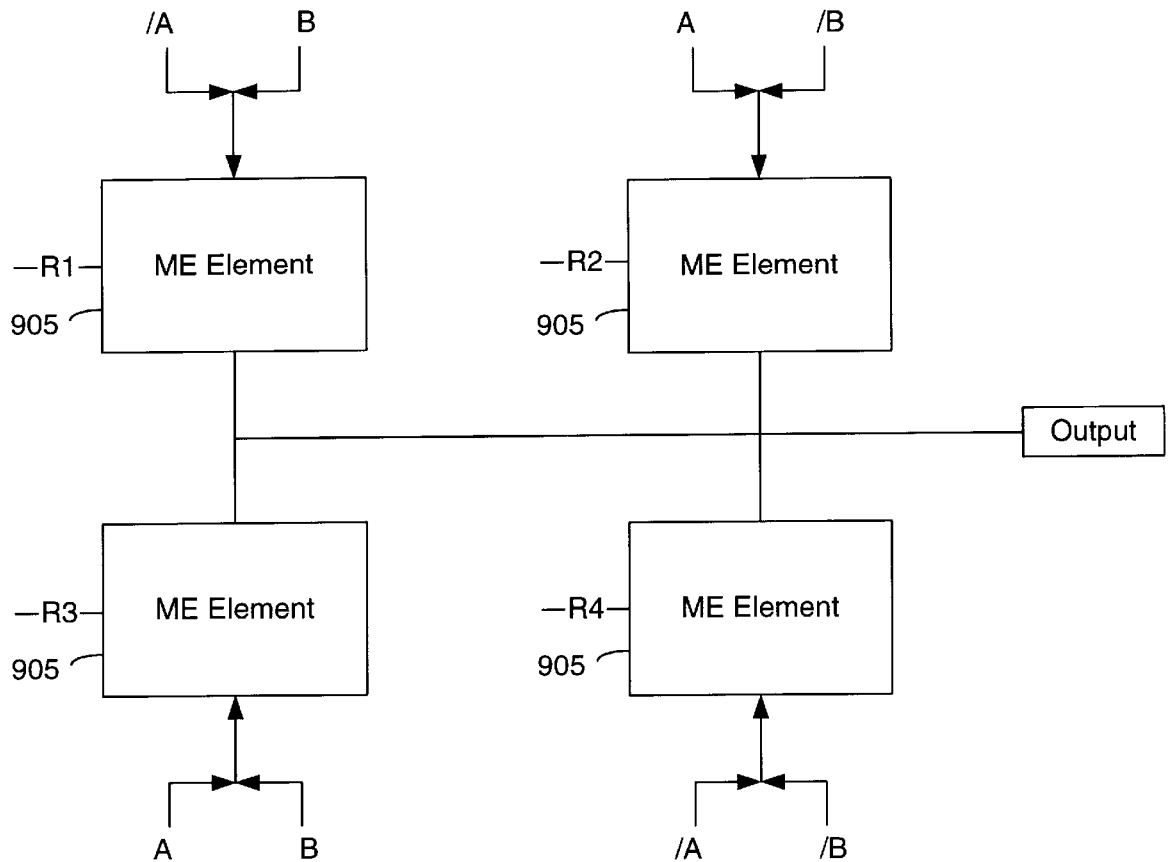
FIG. 9A is a block diagram depiction of a third embodiment of a multi-function logic unit implemented with magneto-electronic logic elements of the present invention.
FIG. 9B is a logic signal table correlating the logic functions performed by the circuit depicted in FIG. 9A.

Another embodiment of an ME BFU is shown in FIG. 9A. This particular circuit has the advantage of not requiring a control signal C, but it does use four ME devices 905 instead of two as described above, and also uses both the regular and inverted form of input signals for A and B, in a similar manner to the prior art. The output, again, can be buffered through a single inverter (not shown), if necessary, raising the total number of elements to 6, but this, too, is significantly less than the 16 FETs identified in the prior art. The truth table for this embodiment is shown in FIG. 9B, and can be seen to include six conventional Boolean logic operations.

A higher level of ME architecture could use the output of one ME device as the input to the read bias terminal of another device, or as the input to the read bias terminal of the same device at a later clock cycle. In this manner, additional beneficial characteristics of feedback, multiple simultaneous output signals, and time-varying outputs can be achieved.

Figures 10A, 10B:
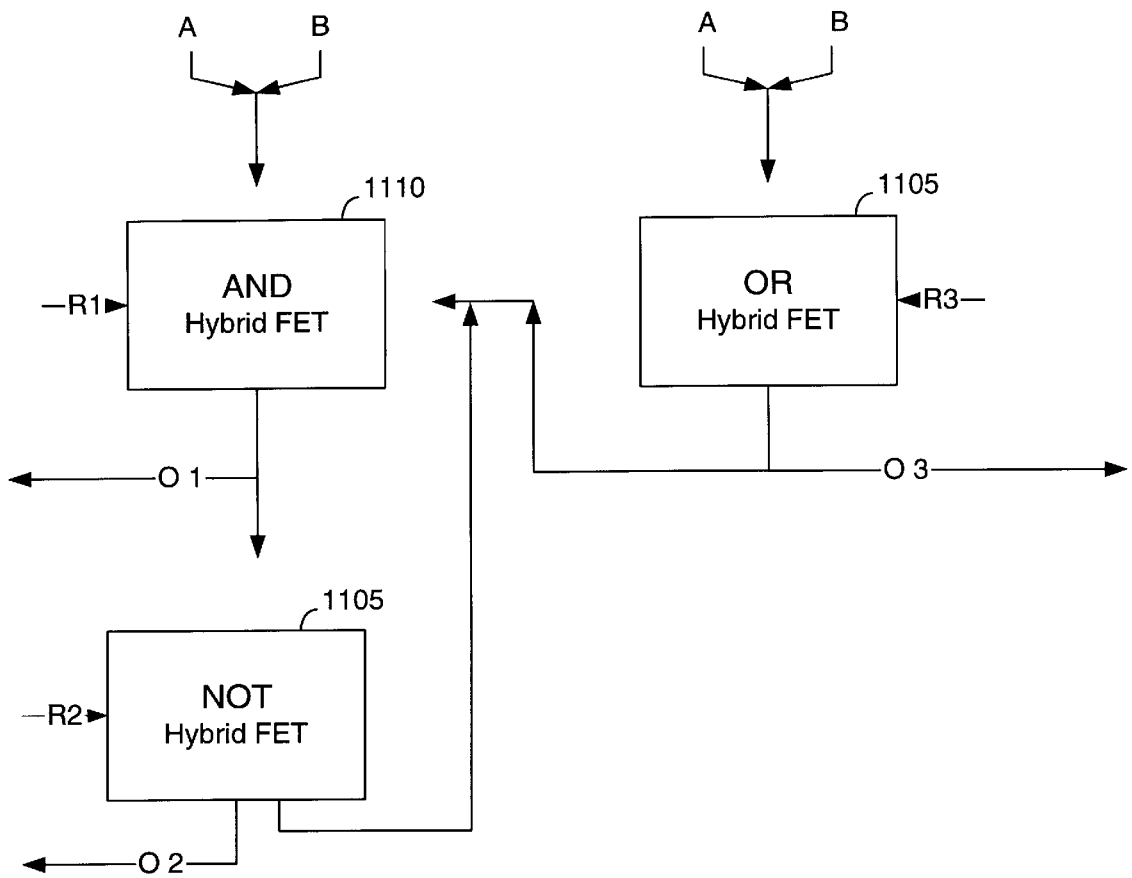
FIG. 10A is a block diagram depiction of a fourth embodiment of a multi-function logic unit implemented with magneto-electronic logic elements of the present invention, wherein the output of such unit can be varied with time.
FIG. 10B is a logic signal table correlating the logic functions performed by the circuit depicted in FIG. 10A as a function of time.

An example of this is shown in FIG. 10A, where a three element ME circuit is illustrated. This circuit also does not require a control signal C, in part because the second ME element 1105 is manufactured to have a "soft" coercivity so that a single high input pulse is sufficient to flip the magnetization state. In contrast, elements 1110 and 1115 are manufactured with "hard" coercivities, and require the presence of two positive or two negative signals respectively to switch state. The outputs, again, of this circuit can be buffered through a single inverter (not shown) if necessary.

As shown in FIG. 10B, outputs O1, O2 and O3 can vary with time, so that the complete range of boolean logical operations are effectuated in this manner, and more than one function is available at one time. For example, at the first clock cycle, O1 and O3 can be read by applying read signals C1 and C3 simultaneously; this results in immediate AND and OR functions at this time. At the next clock cycle, a NAND function is available at O2, while O1 now reads as an XNOR function because the output of 1105 is routed as an additional input signal line to element 1110. At the next clock cycle, output O2 yields an XOR function of signals A and B. It can be seen that this circuit, unlike the prior art, possesses the unique quality that, the same set of hardware elements perform multiple logic functions over time. In a typical SED application, this kind of functionality would have to be performed with an entirely different set of logic gates.

In using ME devices for functions such as binary addition, etc., it may be useful to begin with the lowest level of architecture and use three terminals for A, B and "carry" C inputs. It may also be useful to add additional input terminals to the write line of a ME device.

It is apparent, therefore, that the applicant's invention results in a far higher ratio of logic functions/element for logic circuits than previously attainable with conventional semiconductor devices. This ratio can be a useful figure of merit of sorts to examine the benefits of the present invention for conventional logic circuit design. For example, in the prior art Weste embodiment, 16 separate devices can be arranged to perform at most 6 different functions, which yields a figure of merit of 6/16, or 0.375. In contrast, in FIG. 9, the applicant's devices permit 2 devices to perform 5 functions, which yields a value in excess of 2 (2.5). Even taking into account any necessary signal conversion circuitry, the present invention still gives a value of 5/4, or 1.25. All things being equal, it is apparent that designers of logic circuits would prefer to utilize higher function/element designs, as this will reduce a number of problems in interconnect technology constraints, FET short channel effects, and other known physical and process constraints.

The aforementioned examples richly illustrate how ME devices can be used to create new families of logic devices with functions and performance far beyond conventional semiconductor family devices such as CMOS, TTL, RTL, ECL, Bipolar, etc. Numerous circuit embodiments based on this new type of logic family, including larger collections of cooperating devices, will become apparent to those skilled in the art from reviewing the present disclosure. As an example, the same single circuit constructed in accordance with the present invention may implement an adder function at one moment in time, and a shift register at another moment. A single bit adder can be constructed quite easily from the present teachings as follows: first, the CARRY function can be performed by the single device 650 of FIG. 6, in combination with two FETs for a driver/buffer. The SUM function can be performed by combining an inverted and non-inverted buffered output version of the devices 805 shown in FIG. 8. Conventional FET switches could be used for selecting the appropriate output buffer. In such an embodiment, of course, the control signal C is not necessary, and one of the devices 805 can be fabricated as an OR gate, while the other is fabricated as an AND gate. The net result for this circuit is approximately 3 ME devices, and 6 FETs, which compares extremely favorably with the 28 FETs shown in Weste based on performance characteristics such as packing density, speed, and power dissipation.

Thus, while the present invention has been described in terms of a preferred embodiments, it will be apparent to those skilled in the art that many alterations and modifications may be made to such embodiments without departing from the teachings of the present invention. Accordingly, it is intended that the all such alterations and modifications be included within the scope and spirit of the invention as defined by the appended claims.

What is claimed is:

1. An electronic device for performing a logic operation based on a first input signal and a second input signal, said device comprising:

an input for receiving said first and second input signals; and an electronically configurable element, which element has a logic state that can be adjusted in response to logic values of said first and second signals;

wherein said device can be controlled to perform at least a first and second logic operation on said signals, the first logic operation being different from the second logic operation; and further wherein said logic operation can be controlled by setting the logic state of the device to an initialization state, such that said device performs a first boolean operation when the logic state is set to a first initialization state, and said device performs a second boolean operation when the logic state is set to a second initialization state.

2. The device of claim 1, wherein said logic operation can be controlled by adjusting the signal characteristics of said input signals.

3. The device of claim 2, wherein said device performs a first boolean operation when said first and second input signals have a first range of signal levels, and said device performs a second boolean operation when said first and second input signals have a second range of signal levels.

4. The device of claim 1, wherein said logic operation can be controlled by a control signal input to said device.

5. An electronic device for performing a logic operation based on a first input signal and a second input signal, said device comprising,
- an input for receiving said first and second input signals; and
- an electronically configurable element, which element has a logic state that can be adjusted in response to logic values of said first and second signals and a separate control signal;
- wherein said device can be controlled to perform at least a first and second boolean logic operation on said signals, the first boolean logic operation being different from the second boolean logic operation; and
- further wherein said control signal indicates whether a first or second boolean logic operation is to be performed by the device.

6. An electronic device for performing a logic operation based on a first input signal and a second input signal, said device comprising,
- an input for receiving said first and second input signals; and
- an electronically configurable element, which element has a logic state that can be adjusted in response to logic values of said first and second signals;
- wherein said device can be controlled to perform at least a first and second logic operation on said signals, the first logic operation being different from the second logic operation; and
- further wherein the logic state of the configurable element corresponds to a magnetization state of such element.

7. An electronic device for performing a logic operation based on a first input signal and a second input signal, said device comprising,
- an input for receiving said first and second input signals; and
- an electronically configurable element, which element has a logic state that can be adjusted in response to logic values of said first and second signals;
- wherein said device can be controlled to perform at least a first and second logic operation on said signals, the first logic operation being different from the second logic operation; and
- further wherein said configurable element is electrically isolated from the input.

8. An electronic device for performing a logic operation based on a first input signal and a second input signal, said device comprising,
- an input for receiving said first and second input signals; and
- an electronically configurable element, which element has a logic state that can be adjusted in response to logic values of said first and second signals;
- wherein said device can be controlled to perform at least a first and second logic operation on said signals, the first logic operation being different from the second logic operation; and
- further wherein the configurable element has a surface area less than approximately $50\mu^2$.

9. The device of claim 5, wherein the configurable element can change logic states in less than approximately 40 nanoseconds.

10. The device of claim 5, wherein the logic state of the configurable element is non-volatile.

11. The device of claim 5, wherein the configurable element is substantially electrically inactive until said input signals are presented to said device.

12. An electronic device for performing a logic operation based on a first input signal and a second input signal, the device comprising,
- an input for receiving said first and second input signals; and
- an electronically configurable element, which element has a logic state that can be adjusted in response to logic values of said first and second signals;
- wherein said device can be controlled to perform at least a first and second logic operation on said signals, the first logic operation being different from the second logic operation; and
- further wherein the device uses a spin polarized electron current.

13. An electronic device for performing a logic operation based on a first input signal and a second input signal, said device comprising,
- an input for receiving said first and second input signals; and
- an electronically configurable element which element has a logic state that can be adjusted in response to logic values of said first and second signals;
- wherein said device can be controlled to perform at least a first and second logic operation on said signals, the first logic operation being different from the second logic operation; and
- further wherein the device includes a ferromagnetic layer adapted to be used as said electronically configurable element, and a separate hall effect element.

14. An electronic device for performing a logic operation based on a first input signal and a second input signal, said device comprising,
- an input for receiving said first and second input signals; and
- an electronically configurable element, which element has a logic state that can be adjusted in response to the logic levels of said first and second signals, and a separate control signal;
- wherein said device can perform a first logic operation on said signals during a first time period, and a second, different logic operation on said signals during a second time period under control of said separate control signal.

15. The device of claim 16 wherein said logic operation can be controlled by a control signal input to said device.

16. An electronic device for performing a logic operation based on a first input signal and a second input signal, said device comprising,
- an input for receiving said first and second input signals; and
- an electronically configurable element, which element has a logic state that can be adjusted in response to the logic levels of said first and second signals;

wherein said device can perform a first logic operation on said signals during a first time period, and a second, different logic operation on said signals during a second time period; and further wherein the logic state of the configurable element corresponds to a magnetization state of such element.

17. The device of claim 14 wherein the logic state of the configurable element is non-volatile.

18. An electronic device which can perform a programmable boolean operation based on a first input signal and a second input signal, said device comprising, an input for receiving said first and second input signals; and an electronically configurable element, which element has a logic state that can be adjusted in response to the logic levels of said first and second signals;

wherein said device can be programmed by a control signal to perform a first boolean operation on a first set of said input signals, and can be re-programmed by said control signal to perform a second, different boolean operation on a second set of said input signals.

19. An electronic device which can perform a programmable boolean operation based on a first input signal and a second input signal, said device comprising, an input for receiving said first and second input signals; and an electronically configurable element, which element has a logic state that can be adjusted in response to the logic levels of said first and second signals;

wherein said device can be programmed to perform a first boolean operation on a first set of said input signals, and can be re-programmed to perform a second, different boolean operation on a second set of said input signals; and further wherein the logic state of the configurable element corresponds to a magnetization state of such element.

20. The device of claim 18, wherein the logic state of the configurable element is non-volatile.

21. A device that can perform a logic operation within a logic circuit based on a first input signal and a second input signal, said signals originating from either a first or second logic stage within said logic circuit, said device comprising, an input for receiving said first and second input signals; and an electronically configurable element, which element has a logic state that is based on a magnetization state of said element, and which logic state can be adjusted in response to the logic levels of said first and second signals;

wherein said device can effectuate a first logic operation on said first and second output signals when they originate from said first logic stage, and said device can effectuate a second logic operation different from the first boolean operation on said first and second output signals when such signals originate from said second logic stage.

22. The device of claim 21, wherein the first and second logic operations can be specified by a control signal input to said device.

23. The device of claim 21, wherein the logic state of the configurable element is non-volatile.

24. A device that can perform at least two boolean operations within a logic circuit based on a first input signal and a second input signal, said signals originating from either a first or second logic stage within said logic circuit, said device comprising:

an input for receiving said first and second input signals; and an electronically configurable element, which element has a logic state that is based on a magnetization state of said element, and which logic state can be adjusted in response to the logic levels of said first and second signals;

an output for generating a logic state signal indicative of the state of the configurable element;

wherein said first logic stage treats said device as a first boolean logic device, and said second logic stage simultaneously treats said device as a second boolean logic device.

25. The device of claim 24, wherein the logic state of the configurable element is non-volatile.

26. A magneto-electronic processor for performing a programmable logic operation on a first input signal and a second input signal, said processor comprising, an input for receiving said signals and a programmable control signal associated with said programmable logic operation; and a magneto-electronic element, which element processes said signals based on the logic values of said first and second signals and the programmable control signal; and wherein said processor performs a first logic operation in response to a first value of the programmable control signal, and a second logic operation different from the first logic operation in response to a second value of the programmable control signal which is different from the first value of the programmable control signal.

27. The processor of claim 26, wherein the magneto-electronic element has a non-volatile magnetization state for storing the results of said logic operation.

28. The processor of claim 26, wherein the magneto-electronic element has a surface area less than approximately $50\mu^2$.

29. The processor of claim 26, wherein the magneto-electronic element effectuates said logic operation in less than approximately 40 nanoseconds.

30. The processor of claim 26, wherein the processor includes a device using a spin polarized electron current.

31. The processor of claim 26, wherein the processor includes a ferromagnetic layer adapted to be used as said magneto-electronic element, and a separate hall effect element.

32. A method of performing logic operations using an electronically configurable logic gate, said method comprising the steps of:

configuring said gate to perform a first logic operation; and applying a first input logic signal and a second input logic signal to said gate; and modifying a logic state of said gate in response to values of said first and second logic signals to effectuate a first logic operation on the first and second signals; and configuring said gate to perform a second logic operation; and applying a third input logic signal and a fourth input logic signal to said gate;

modifying a logic state of said gate element in response to logic values of said third and fourth logic signals to effectuate a second logic operation on the third and fourth signals, the first logic operation being different from the second logic operation;

wherein the logic state of the logic gate corresponds to a magnetization state of a configurable magneto-electronic element associated with the logic gate.

33. The method of claim 32, wherein the first and second logic operations can be controlled by adjusting signal characteristics of the first, second, third and fourth input signals.

34. The method of claim 32, wherein said logic operations can be controlled by setting the logic state of the gate to an initialization state.

35. The method of claim 32, wherein the first and second logic operation can be controlled by a control signal input to the logic gate.

36. A method of performing logic operations using an electronically configurable logic gate, said method comprising the steps of:

configuring said gate to perform a first logic operation; and applying a first input logic signal and a second input logic signal to said gate; and modifying a logic state of said gate in response to values of said first and second logic signals to effectuate a first logic operation on the first and second signals; and configuring said gate to perform a second logic operation; and applying a third input logic signal and a fourth input logic signal to said gate;

modifying a logic state of said gate element in response to logic values of said third and fourth logic signals to effectuate a second logic operation on the third and fourth signals, the first logic operation being different from the second logic operation;

wherein the logic state of the logic gate corresponds to a magnetization state of a configurable magneto-electronic element associated with the logic gate; and further wherein the logic state of the logic gate is non-volatile.

37. A method of performing logic operations using an electronically configurable logic gate, said method comprising the steps of:

configuring said gate to perform a first logic operation; and applying a first input logic signal and a second input logic signal to said gate; and modifying a logic state of said gate in response to values of said first and second logic signals to effectuate a first logic operation on the first and second signals; and configuring said gate to perform a second logic operation; and applying a third input logic signal and a fourth input logic signal to said gate;

modifying a logic state of said gate element in response to logic values of said third and fourth logic signals to effectuate a second logic operation on the third and fourth signals, the first logic operation being different from the second logic operation;

wherein the logic state of the logic gate corresponds to a magnetization state of a configurable magneto-electronic element associated with the logic gate, and said configurable element has a surface area less than approximately $50\mu^2$.

38. A method of operating a logic gate, which gate includes a configurable magneto-electronic element for implementing a logic operation based on input signals ting from either a first or second logic circuit, said method comprising the steps of:

configuring said gate to implement a first logic operation in response to input signals from a first logic circuit; and configuring said gate to implement a second logic operation in response to input signals from said second logic circuit;

wherein at any instance in time said gate can perform either of the first or second operations, and where the second logic operation is different from the first logic operation.

39. The method of claim 38, wherein said gate is configured by a control signal input to said gate.

40. The method of claim 38 wherein the configurable element is non-volatile.

41. A method of operating a logic gate, which gate implements a logic operation based on input signals originating from either a first or second logic circuit, said method comprising the steps of:

configuring said gate to implement a first logic operation including a logical OR function in response to input signals from a first logic circuit; and configuring said gate to implement a second logic operation including a logical AND function in response to input signals from said second logic circuit;

wherein at any instance in time said gate can perform either of the first or second operations, and where the second logic operation is different from the first logic operation.

42. A method of operating a logic gate, which gate implements a logic operation based on signals received at an input originating from either a first or second logic circuit, said method comprising the steps of:

configuring said gate to implement a first logic operation when the input receives signals from the first logic circuit; and configuring said gate to implement a second logic operation when the input receives signals from the second logic circuit;

wherein at any instance in time said gate can perform either of the first or second operations, and where the second logic operation is different from the first logic operation, such that said gate effectively implements two different logical operations simultaneously.

43. A method of implementing a magneto-electronic processor, which processor performs a programmable logic operation on a first input signal and a second input signal, said method comprising the steps of:

providing an input for receiving said signals and a programmable control signal associated with said programmable logic operation; and providing a magneto-electronic element;

processing said signals with the magneto-electronic element to effectuate a first logic operation in response to a first value of the programmable control signal; and processing said signals with the magneto-electronic element to effectuate a second logic operation in response to a second value of the programmable control signal, which second logic operation is different from the first logic operation.

44. The method of claim 43, wherein the magnetoelectronic element has a non-volatile magnetization state for storing the results of said programmable logic operation.

45. The method of claim 43, wherein the processor includes a device using a spin polarized electron current.

46. The method of claim 43, wherein the processor includes a ferromagnetic layer adapted to be used as said magneto-electronic element, and a separate hall effect element.

47. An electronic device for performing logic operations on a first and second input signal, said device comprising:

an input for receiving said first and second input signals; and an electronically configurable element, which element has a logic state that can be adjusted in response to logic values of said first and second signals;

said device being adapted such that:
(i) when said first and second signals span a first amplitude range between a first logical high state and a first logical low state said device performs a first logic operation said first and second signals; and
(ii) when said first and second signals span a second amplitude range between a second logical high state and a second logical low state said device performs a second logic operation on said first and second signals, said second logic operation being different from said first logic operation.

48. The device of claim 47, wherein a logic operation performed by said device is a function of said first and second signals and a separate control signal.

49. The device of claim 47, wherein said electronically configurable element is a magneto-electronic element electrically isolated from the input.

50. The device of claim 47, wherein the logic state of the electronically configurable element is latched and non-volatile.

51. The device of claim 47, wherein said second amplitude range is approximately twice said first amplitude range.

52. A method of performing logic operations on a first and second input signal, comprising the steps of:

(a) receiving said first and second input signals; and (b) generating an output in response to logic values of said first and second signals using a configurable electronic element, said output being based on either a first or second logic operation performed on said first and second signals, such that:
(i) when said first and second signals span a first amplitude range between a first logical high state and a first logical low state, said output is based on a first logic operation performed on said first and second signals; and
(ii) when said first and second signals span a second amplitude range between a second logical high state and at second logical low state, said output is based on a second logic performed on said first and second signals, said second logic operation being different from said first logic operation.

53. The method of claim 52, further including a step (c): receiving a control signal to determine whether said first logic operation or said second logic operation is to be performed.

54. The method of claim 52, wherein said electronically configurable element is a magneto-electronic element electrically isolated from the first and second input signals.

55. The method of claim 52, further including a step (c): latching a logic state of said output.

56. The method of claim 52, wherein said second amplitude range is approximately twice said first amplitude range.

57. The method of claim 52, further including a step (c): initializing said configurable element to specify a first boolean operation to be performed for said first logic operation, and a second boolean operation to be performed for said second logic operation.

* * * * *